US012685128B2

(12) United States Patent

Katakam et al.

(10) Patent No.: US 12,685,128 B2
(45) Date of Patent: Jul. 14, 2026

(54) FRONTSIDE TO BACKSIDE CONNECTION WITHIN DOUBLE DIFFUSION BREAK

(71) Applicant: INTERNATIONAL BUSINESS MACHINES CORPORATION, Armonk, NY (US)

(72) Inventors: Shravana Kumar Katakam, Lehi, UT (US); Sagarika Mukesh, Albany, NY (US); Tao Li, Slingerlands, NY (US); Ruilong Xie, Niskayuna, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 18/327,126

(22) Filed: Jun. 1, 2023

(65) Prior Publication Data

US 2024/0404944 A1 Dec. 5, 2024

(51) Int. Cl.
H10W 20/42 (2026.01)
H10D 86/00 (2025.01)
(Continued)

(52) U.S. Cl.
CPC ............ H10W 20/42 (2026.01); H10D 86/00 (2025.01); H10W 10/014 (2026.01); H10W 10/17 (2026.01); H10W 20/084 (2026.01)

(58) Field of Classification Search
CPC . H10W 20/42; H10W 20/084; H10W 20/069; H10W 20/0696; H10W 20/427;
(Continued)

(56) References Cited

U.S. PATENT DOCUMENTS 7,531,407 B2    5/2009   Clevenger
9,412,616 B1 *  8/2016   Xie ......................... H10D 30/62
(Continued)

FOREIGN PATENT DOCUMENTS

CN        121359610 A      1/2026
EP          4372794 A1     5/2024
(Continued)

OTHER PUBLICATIONS

International Searching Authority, "Notification of Transmittal of the International Search Report and the Written Opinion of the International Searching Authority, or Declaration," Patent Cooperation Treaty, Aug. 29, 2024, 21 pages, International Application No. PCT/EP2024/060170.

(Continued)

*Primary Examiner* — Dao H Nguyen
(74) *Attorney, Agent, or Firm* — Seed Intellectual Property Law Group LLP

(57) ABSTRACT

A semiconductor IC device includes a conductive through device connection. The connection may be located within a double diffusion break (DDB) region that separates active regions. The connection may include a faux S/D region between a frontside contact and a backside contact. The semiconductor IC device may further include a first and/or second diffusion break isolation rail. The connection may be between the first and second diffusion break isolation rails. The connection location within the DDB region may resultantly increase packing densities of the semiconductor IC device. Further, the connection may reduce routing complexities and resistance through the semiconductor IC device, which may improve semiconductor IC device performance. Further, the connection may utilize mirrored structure instances (e.g., frontside contact, backside contact, faux S/D region, or the like) as that are used by microdevices (Continued)

(e.g., transistors, or the like) within the active regions, which may decrease fabrication complexities.

19 Claims, 17 Drawing Sheets

(51) Int. Cl.

| | |
|---|---|
| *H10W 10/00* | (2026.01) |
| *H10W 10/17* | (2026.01) |
| *H10W 20/00* | (2026.01) |

(58) Field of Classification Search
CPC . H10W 20/481; H10W 10/014; H10W 10/17; H10W 30/014; H10W 30/43; H10W 30/6757; H10D 62/121; H10D 64/254; H10D 84/0149; H10D 84/0151; H10D 84/038; H10D 84/83
See application file for complete search history.

(56) References Cited

U.S. PATENT DOCUMENTS

| | | | | |
|---|---|---|---|---|
| 10,002,836 | B2 | 6/2018 | Spitzlsperger | |
| 10,622,479 | B1* | 4/2020 | Yang | H10D 84/0188 |
| 10,636,739 | B2 | 4/2020 | Beyne | |
| 10,665,669 | B1* | 5/2020 | Xie | H10D 84/0158 |
| 11,373,999 | B2 | 6/2022 | Wang | |
| 12,356,702 | B2* | 7/2025 | Huang | H10D 84/0188 |
| 12,402,384 | B2* | 8/2025 | Wang | H10D 84/038 |
| 2017/0141211 | A1* | 5/2017 | Xie | H10D 64/017 |
| 2020/0035705 | A1* | 1/2020 | Kim | H10D 64/017 |
| 2020/0058652 | A1* | 2/2020 | Park | H10D 30/6211 |
| 2020/0343144 | A1* | 10/2020 | Li | H10D 84/834 |
| 2021/0305252 | A1 | 9/2021 | Chiang | |
| 2022/0130759 | A1 | 4/2022 | Huang | |
| 2022/0139911 | A1 | 5/2022 | Wei | |
| 2022/0262687 | A1* | 8/2022 | Huang | H10D 84/0158 |
| 2022/0285494 | A1 | 9/2022 | Huang | |
| 2022/0310594 | A1* | 9/2022 | Jeong | H10D 84/038 |
| 2023/0139929 | A1 | 5/2023 | Xie et al. | |
| 2024/0030283 | A1* | 1/2024 | Jung | H10D 30/6735 |
| 2024/0178136 | A1* | 5/2024 | Xie | H10D 84/0186 |
| 2024/0347423 | A1* | 10/2024 | Mukesh | H10D 84/0149 |
| 2025/0120114 | A1* | 4/2025 | Jeong | H10D 30/6219 |

FOREIGN PATENT DOCUMENTS

| | | |
|---|---|---|
| KR | 10-2025-0097877 A | 6/2025 |
| WO | 2018063302 A1 | 4/2018 |
| WO | 2024/245633 A1 | 12/2024 |

OTHER PUBLICATIONS

Bauer, et al., "Alignment Technology for Backside Integration." Published Feb. 2011 by Research Gate. 12 pages. In Proceedings of SPIE—The International Society for Optical Engineering 7985. https://www.researchgate.net/publication/252343653_Alignment_Technology_for_Backside_Integration.

Li, et al., "Backside Power Deliver Network Connection Through Dummy Gates," U.S. Appl. No. 17/902,275, filed Sep. 2, 2022.

Intellectual Property Office, "Request for the Submission of an Opinion," Feb. 24, 2026, 9 Pages, KR Application No. 10-2025-7016779.

\* cited by examiner

300

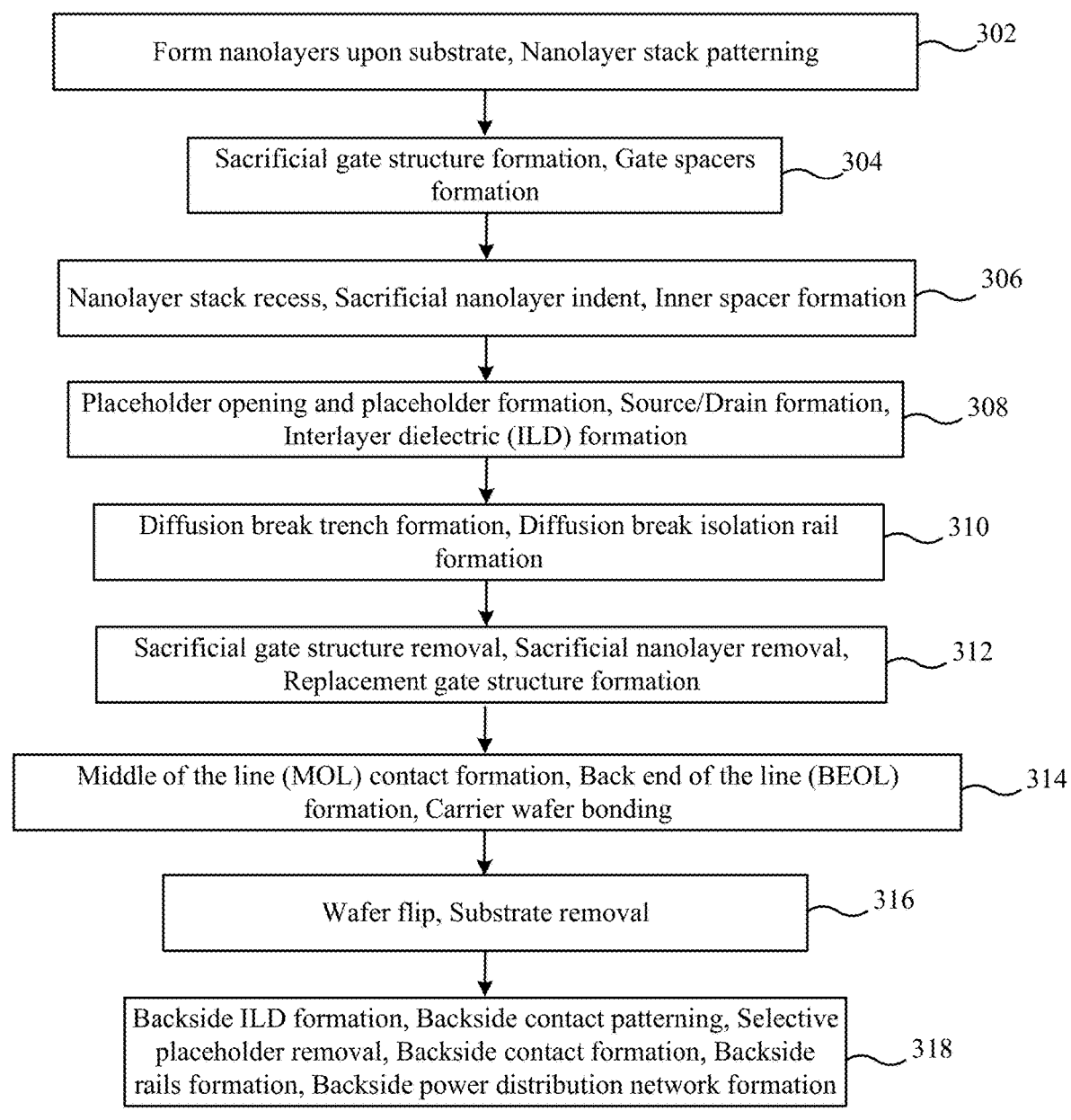

Form nanolayers upon substrate, Nanolayer stack patterning ⟍302

Sacrificial gate structure formation, Gate spacers formation ⟍304

Nanolayer stack recess, Sacrificial nanolayer indent, Inner spacer formation ⟍306

Placeholder opening and placeholder formation, Source/Drain formation, Interlayer dielectric (ILD) formation ⟍308

Diffusion break trench formation, Diffusion break isolation rail formation ⟍310

Sacrificial gate structure removal, Sacrificial nanolayer removal, Replacement gate structure formation ⟍312

Middle of the line (MOL) contact formation, Back end of the line (BEOL) formation, Carrier wafer bonding ⟍314

Wafer flip, Substrate removal ⟍316

Backside ILD formation, Backside contact patterning, Selective placeholder removal, Backside contact formation, Backside rails formation, Backside power distribution network formation ⟍318

FIG. 17

FRONTSIDE TO BACKSIDE CONNECTION WITHIN DOUBLE DIFFUSION BREAK

BACKGROUND

Various embodiments of the present disclosure generally relate to semiconductor integrated circuit (IC) device fabrication operations and resulting semiconductor IC devices. More specifically the various embodiments of the present disclosure relate to a frontside to backside connection within a double diffusion break region of a semiconductor IC device.

Conventional semiconductor IC devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes.

One particularly radical technology change entailed redesigning the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowires, nanosheets, or the like, that are isolated from the substrate. In the GAA FET, channel surfaces are in respective contact with the source and drain and other respective channel surfaces are in contact with and surrounded by the gate.

The various transistor devices that are formed within the semiconductor IC device must be electrically isolated from one another to properly function in an electrical circuit. Typically, this is accomplished by forming a trench in a substrate, and filling the trench with an insulating material, such as silicon dioxide. Within the industry, these isolation regions may sometimes be referred to as "diffusion breaks." However, the formation of such isolation structures consumes very valuable plot space on the substrate. Moreover, in some applications, such as those integrated circuit products employing GAA FET devices, as device sizes have decreased, and packing densities have increased, it is sometimes difficult to form the desired isolation region made of an insulating material.

SUMMARY

In an embodiment of the present disclosure, a semiconductor IC device is presented. The semiconductor IC device includes a dual diffusion break (DDB) region between respective active regions and a conductive through device connection within the DDB region. The conductive through device connection includes at least a faux source/drain (S/D) region. The conductive through device connection may reduce routing complexities and resistance through the semiconductor IC device, which may improve semiconductor IC device performance. Further, the conductive through device connection may utilize mirrored structure instances (e.g., faux S/D region, or the like) to those that are used by microdevices (e.g., transistors, or the like) within the respective active regions, which may decrease semiconductor IC device fabrication complexities.

In an example, the DDB region includes a first diffusion break isolation rail and a second diffusion break isolation rail. The first diffusion break isolation rail and the second diffusion break isolation rail may at least partially define or bound the DDB region and may further allow additional features to be located therebetween to increase packaging and/or routing densities.

In an example, the conductive through device connection is between the first diffusion break isolation rail and the second diffusion break isolation rail. The conductive through device connection may take advantage of the plot space associated with the DDB region and may resultantly increase packing densities of the semiconductor IC device.

In an example, the conductive through device connection further comprises a frontside contact and a backside contact, with the faux S/D region being located between the frontside contact and the backside contact. The faux S/D region is an exemplary utilization of a mirrored material instance to those that are used by microdevices (e.g., transistors, or the like) within the respective active regions, which may decrease semiconductor IC device fabrication complexities.

In an example, the semiconductor IC device further includes a first one or more faux channels that connect the faux S/D region and the first diffusion break isolation rail and a second one or more faux channels that connect the faux S/D region and the second diffusion break isolation rail. The faux channels are another exemplary utilization of mirrored material instances to those that are used by microdevices (e.g., transistors, or the like) within the respective active regions, which may decrease semiconductor IC device fabrication complexities.

The semiconductor IC device may further include a front side back end of the line (BEOL) network connected to the frontside contact and a back side power distribution network (BSPDN) connected to the backside contact. In utilizing the frontside BEOL and the BSPDN, the conductive through device connection may provide a reduced resistance entirely through the semiconductor IC device, relative to other through device connection structures, which may improve semiconductor IC device performance.

In another example, the frontside contact, the backside contact, and the faux S/D region are vertically aligned. The vertical alignment of the frontside contact, the backside contact, and the faux S/D may minimize the resistance and/or length of the conductive through device connection through the semiconductor IC device.

In another example, a bottom surface of the faux S/D region is above respective bottom surfaces of the first diffusion break isolation rail and the second diffusion break isolation rail. This arrangement of the first diffusion break isolation rail and the second diffusion break isolation rail may reduce shorting propensities between the backside contact and S/D region(s) within the respective active regions.

In an example, an active region of the respective active regions includes a transistor with a S/D region. The S/D region is an exemplary functional (i.e., not a faux S/D region) source or drain used by the transistor within an active region. In an example, the faux S/D region structurally and materially mirrors the S/D region. The faux S/D region may have the same or substantially similar geometry and may be formed of the same or substantially similar material as the S/D region, which may decrease semiconductor IC device fabrication complexities.

In an example, an active region of the respective active regions includes a backside contact placeholder below and connected to the S/D region. In other words, the backside contact placeholder may be retained and may decrease shorting propensities.

In an example, the semiconductor IC device further includes a first spacer. The first diffusion break isolation rail is between the first spacer. A first conductive gate, such as a replacement gate structure, is between the first spacer and in line with the first diffusion break isolation rail. In this manner, the first diffusion break isolation rail may additionally serve as a gate cut isolation region to one or more inline gate structure(s) that share the same spacer.

In an embodiment of the present disclosure, a semiconductor IC device is presented. The semiconductor IC device includes a first diffusion break isolation rail, a second diffusion break isolation rail, and a conductive through device connection between the first diffusion break isolation rail and the second diffusion break isolation rail. In this manner, the conductive through device connection may take advantage of the plot space associated with the double diffusion break (DBB) region that is associated with the first and second diffusion break isolation rails and may resultantly increase packing densities of the semiconductor IC device.

In an example, the conductive through device connection includes a faux source/drain (S/D) region. In this manner, the conductive through device connection may utilize mirrored structure instances (e.g., faux S/D region, or the like) to those that are used by microdevices (e.g., transistors, or the like) within the respective active regions, which may decrease semiconductor IC device fabrication complexities.

In an example, the conductive through device connection further includes a frontside contact and a backside contact, where the faux S/D region is between the frontside contact and the backside contact. In this manner, the conductive through device connection may utilize additional mirrored structure instances (e.g., frontside contact, backside contact, or the like) to those that are used by microdevices within the respective active regions, which may further decrease semiconductor IC device fabrication complexities.

In an example, the semiconductor IC device further includes a first one or more faux channels that connect the faux S/D region and the first diffusion break isolation rail and a second one or more faux channels that connect the faux S/D region and the second diffusion break isolation rail. The faux channels are another exemplary utilization of mirrored material instances to those that are used by microdevices within the respective active regions, which may decrease semiconductor IC device fabrication complexities.

In an example, the semiconductor IC device may further include a front side back end of the line (BEOL) network connected to the frontside contact and a back side power distribution network (BSPDN) connected to the backside contact. In utilizing the frontside BEOL and the BSPDN, the conductive through device connection may provide a reduced resistance entirely through the semiconductor IC device, relative to other through device connection structures, which may improve semiconductor IC device performance.

In an example, the frontside contact, the backside contact, and the faux S/D region are vertically aligned. The vertical alignment of the frontside contact, the backside contact, and the faux S/D may minimize the resistance and/or length of the conductive through device connection through the semiconductor IC device.

In an example, the semiconductor IC device further include a transistor that has a S/D region and a third one or more faux channels connect the first diffusion break isolation rail and the S/D region. The faux channels are another exemplary utilization of mirrored material instances to those that are used by microdevices within the respective active regions, which may decrease semiconductor IC device fabrication complexities.

These and other embodiments, features, aspects, and advantages will become better understood with reference to the following description, appended claims, and accompanying drawings.

BRIEF DESCRIPTION OF THE DRAWINGS

FIG. 17 depicts a flow diagram illustrating a semiconductor IC device fabrication method to fabricate a semiconductor IC device that includes a backside to frontside connection within a DDB region, in accordance with one or more embodiments of the disclosure.

DETAILED DESCRIPTION

Figure 1:
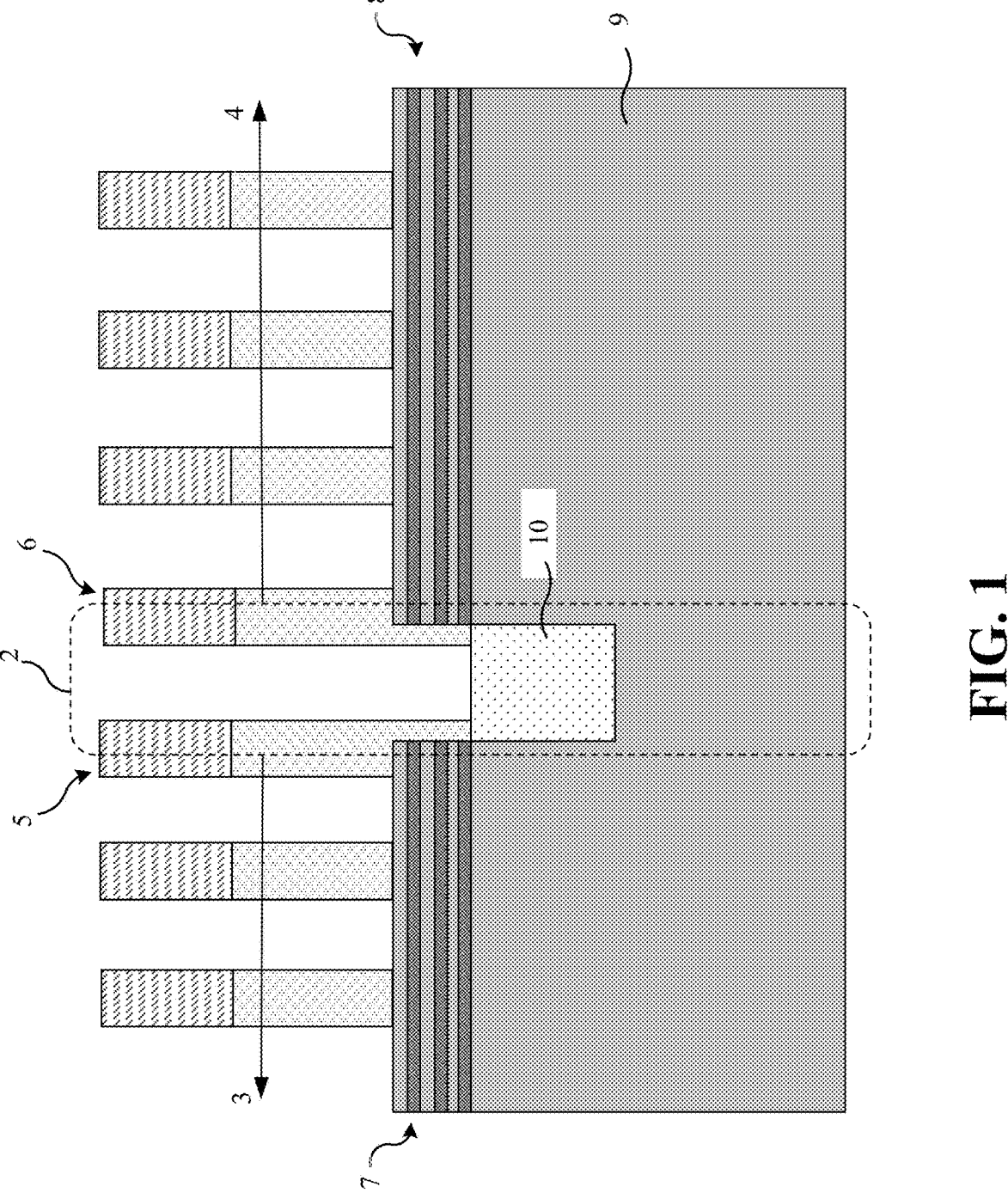
FIG. 1 depicts a semiconductor IC device that includes a DDB region.

Embodiments are disclosure with the understanding that the separation of neighboring or adjacent active regions within a semiconductor IC device is desirable. With reference to FIG. 1, semiconductor IC device 1 is depicted at an intermediary fabrication stage comprised of GAA FET device(s) that are to be formed above or within an active region 3 or within an active region 4 that are separated by a double diffusion break (DDB) region 2. DBB region 2 may be associated with isolation material 10 positioned between the two active regions 3, 4. In this example, the GAA FET devices include one or more gate structures 5, 6. One gate structure 5 covers the edges of the active region 3 so that an associated nanolayer stack 7 may be tucked therein. The nanolayer stack 7 may be further processed to effectively form the channels of the GAA FET device(s) within active region 3. Similarly, one gate structure 6 covers the edges of the active region 4 so that an associated nanolayer stack 8 may be tucked therein. The nanolayer stack 8 may be further processed to effectively form the channels of the GAA FET device(s) within active region 4.

It may be easier to form DDB region 2 relative to forming a related but different single diffusion break (SDB) region, due to the relatively larger width or size of the DDB region 2. However, the use of DDB region 2 consumes more of the available plot space on the substrate 9 than does the use of SDB regions, thereby leading to reduced packing densities.

The various embodiments of present disclosure are directed to techniques of fabricating DDB region(s) on semiconductor IC devices and incorporating useful features within the DDB region(s) that may take advantage of the generally unused plot space generally associated therewith, thereby leading to increased packing densities.

Figure 2:
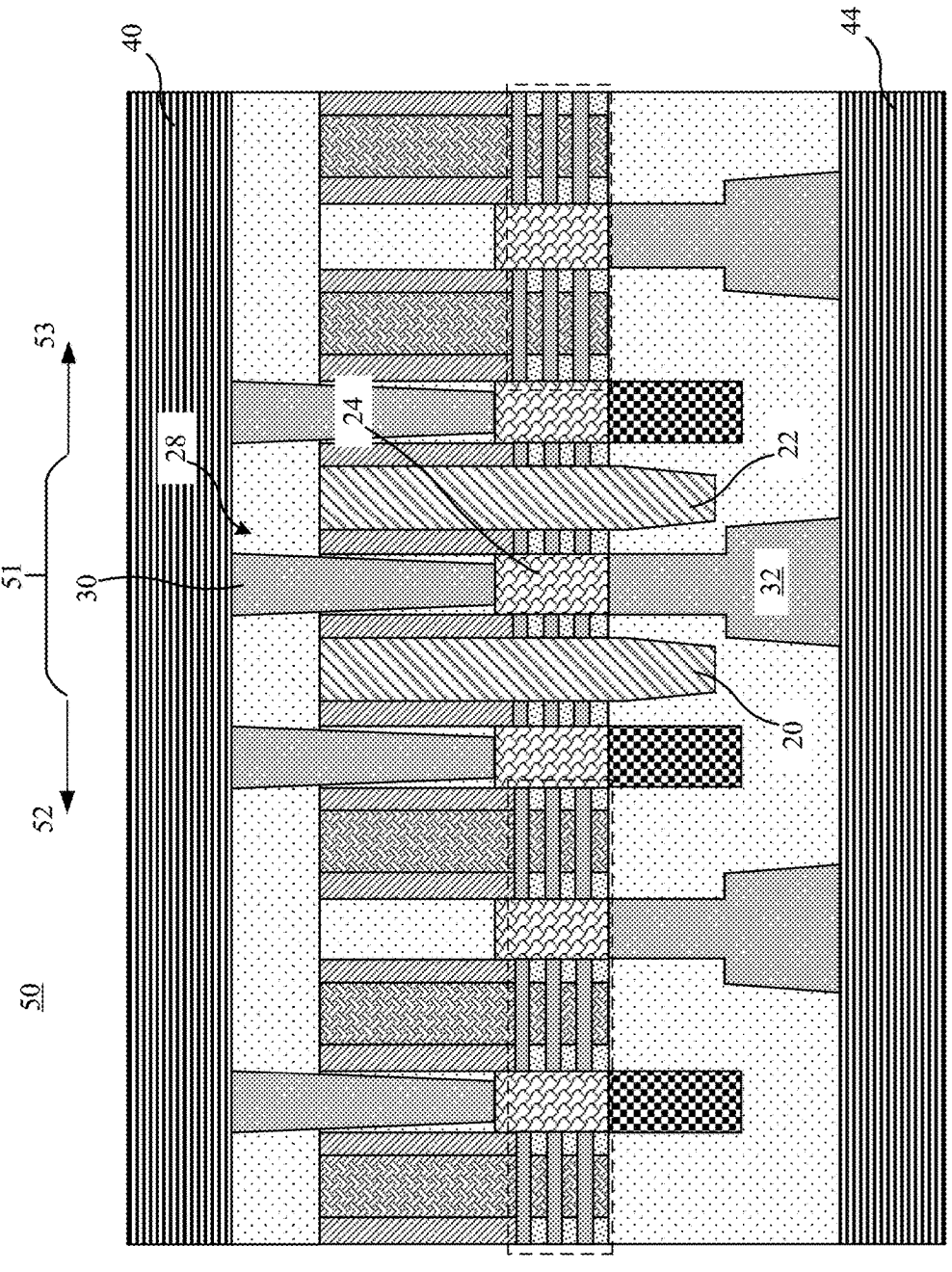
FIG. 2 depicts a semiconductor IC device that a includes a backside to frontside connection within a DDB region, in accordance with one or more embodiments of the disclosure.

Referring to FIG. 2 which depicts a semiconductor IC device 50 that includes a backside to frontside connection 28 within a DDB region 51 that separates an active region 52 from an active region 53, in accordance with one or more embodiments of the disclosure. The conductive through device connection 28 connects to and/or accesses the frontside of the semiconductor IC device 50 and connects to and/or accesses the backside of the semiconductor IC device 50. In an example, the conductive through device connection 28 may include a frontside contact 30, a backside contact 32, and a faux source/drain region 24 between the frontside contact 30 and the backside contact 32. The DDB region 51 may further include a diffusion break isolation rail 20 and/or a diffusion break isolation rail 22. In an example, the conductive through device connection 28 may be located between diffusion break isolation rail 20 and diffusion break isolation rail 22.

In an example, the respective diffusion break isolation rail(s) 20, 22 may serve to define the lateral boundary of DDB region 51. In other words, a right sidewall of diffusion break isolation rail 22 may serve as a right-side boundary to DDB region 51 and a left sidewall of diffusion break isolation rail 20 may serve as a left side boundary to DDB region 51. In an example, diffusion break isolation rails 20, 22 further serve as a gate cut isolation region that separate inline gate structure(s) that exist further into and out of the page. In other words, the diffusion break isolation rails 20, 22 may have a dimension into and/or out of the page sufficient to separate gate structure(s) that exist further into and out of the page that are inline therewith.

The conductive through device connection 28 within the DDB region 51 takes advantage of the plot space associated with the DDB region 51 and may resultantly increase packing densities of the semiconductor IC device 50. Further, the conductive through device connection 28 within the DDB region 51 may reduce routing complexities through the semiconductor IC device 50 and may further reduce parasitic capacitance therewithin relative to other through device connection structures.

The conductive through device connection 28 within the DDB region 51 may be connected to a back end of the line (BEOL) network 40 that is located on the frontside of the semiconductor IC device 50 and may be connected to a backside power distribution network (BSPDN) 44 that is located on the backside of the semiconductor IC device 50. In utilizing the BSPDN 44, the conductive through device connection 28 may provide a reduced resistance through the semiconductor IC device 50, relative to other through device connection structures, which may improve semiconductor IC device 50 performance. Further, the conductive through device connection 28 within the DDB region 51 may utilize mirrored or similar structure instances (e.g., frontside contact 30, backside contact 32, faux S/D region 24, or the like) as that are used by microdevices (e.g., transistors, or the like) within the active regions 52, 53 of the semiconductor IC device 50, which may decrease semiconductor IC device 50 fabrication complexities.

Although this detailed description includes examples of how embodiments of the disclosure can be implemented to form an exemplary semiconductor IC device with GAA FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable for the semiconductor IC device to include a conductive through device connection within its DDB region, according to one or more disclosed embodiments.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device that will be packaged into a final or packaged IC, fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present disclosure, transistors are a type of microdevice commonly found in a wide variety of semiconductor IC devices. Typical semiconductor IC devices may be formed using or within active regions of a wafer. The active regions are defined by isolation or diffusion break regions used to separate and electrically isolate the adjacent active regions. In these typical IC devices, it may be difficult to form a through device connection in these isolation or diffusion break regions.

An exemplary semiconductor IC device includes a plurality of GAA FETs. Each GAA FET has a source and a drain that are formed in an active region of a semiconductor layer by implanting n-type or p-type impurities in the respective source and the drain material. Disposed between the source and the drain is a channel (or body) region. Disposed around the channel is the gate. The gate and the source and the gate and the drain are spaced apart by a dielectric layer or spacer.

GAA FETs may be fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a nanolayer, such as a nanowire, or nanosheet. These GAA FETs provide a relatively small FET footprint by forming the channel as a series of vertical nanolayers.

In a known GAA configuration, a nanolayer-based FET includes a source region, a drain region, and stacked nanolayer channels between the source and drain regions. A gate surrounds the stacked nanolayer channels and regulates electron and hole flow through the nanolayer channels between the source and drain regions. GAA FETs may be fabricated by forming alternating layers of channel nanolayer and sacrificial nanolayer layers. The sacrificial nanolayer layers are released from the channel nanolayers before the GAA FET device is finalized. For n-type GAA FETs, the channel nanolayer layers may be silicon (Si) and the sacrificial nanolayer layers may be silicon germanium (SiGe). For p-type GAA FETs, in some implementations, the channel nanolayer layers may be SiGe and the sacrificial nanolayer layers may be Si. In other implementations, p-type GAA FETs, the channel nanolayer may be Si, and the sacrificial nanolayer can be SiGe. In some implementations, the channel nanolayer layers may initially be Si and can be converted to SiGe or other material, after sacrificial nanolayer layers are removed.

Turning now to a more detailed description of fabrication operations and resulting structures according to embodiments of the disclosure, FIG. 3 through FIG. 16 depict a semiconductor IC device 100 device that includes, or is to include, a conductive through device connection within a DDB region, after various fabrication operations. For ease of illustration, the fabrication operations depicted therein will be described in the context of forming elements of GAA FET(s) within neighboring active regions and with forming the conductive through device connection within the DDB region that is between the neighboring active regions. Although the cross-sectional structural diagrams depicted in the drawings are two-dimensional, the diagrams depicted represent three-dimensional devices.

Figure 3:
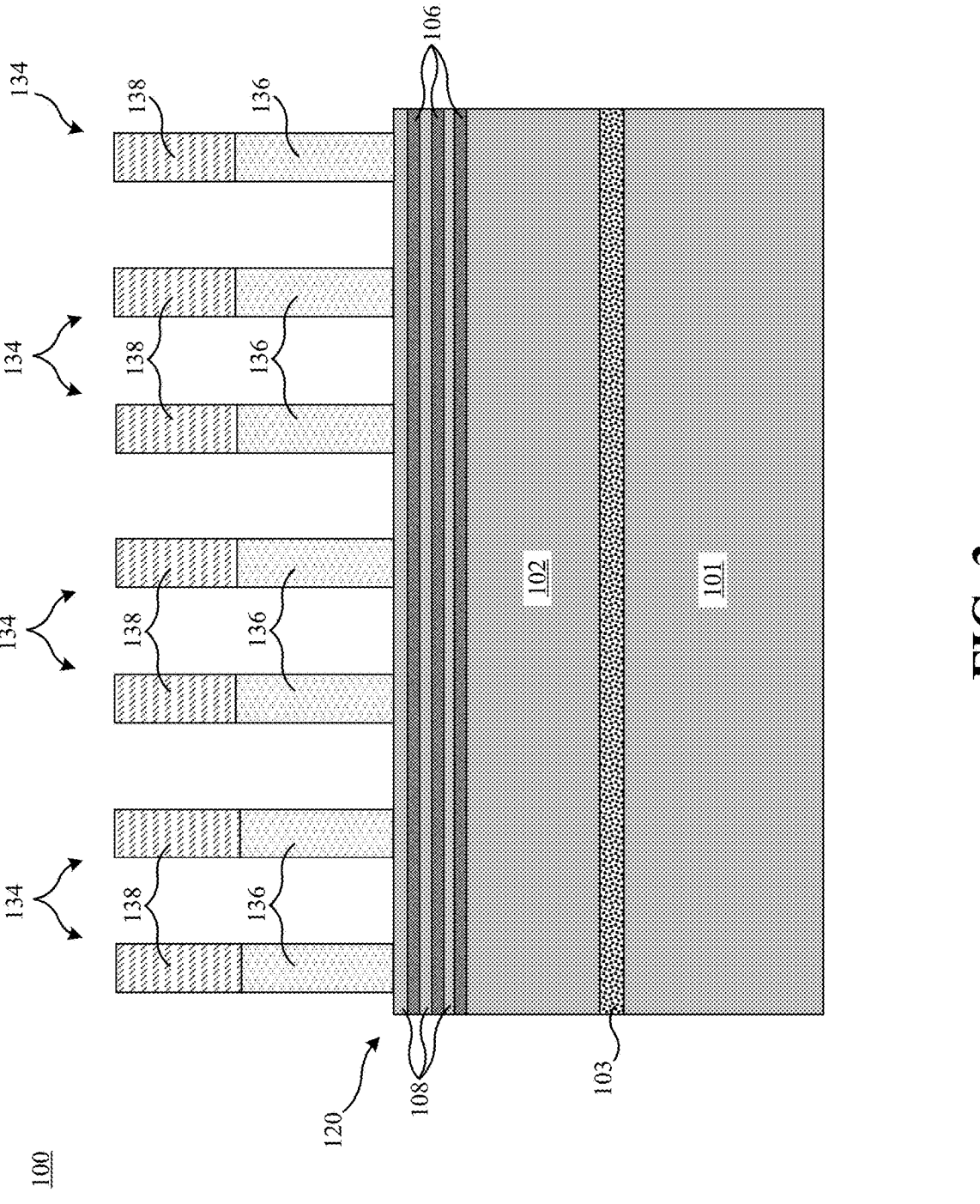
FIG. 3 through FIG. 16 depict fabrication stage views of a semiconductor IC device that is to include or does include a backside to frontside connection within a DDB region, in accordance with one or more embodiments of the disclosure.

FIG. 3 depicts cross-sectional views of the semiconductor IC device 100 after initial fabrication operations, in accordance with embodiments of the present disclosure. In the present fabrication stage, one or more nanolayers are formed upon a substrate, the one or more nanolayers are patterned into one or more nanolayer stacks, and one or more sacrificial gate structures 134 are formed.

The substrate may include a multilayered substrate that includes an upper substrate 102 and a lower substrate 101. An etch stop layer 103 may be located between the upper substrate 102 and the lower substrate 101. The etch stop layer 103 is generally formed of a material with etch selectivity to upper substrate 102 and/or lower substrate 101. Non-limiting examples of suitable materials for the upper substrate 102 and/or lower substrate 101 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Nanolayers may be formed by forming an alternating series of sacrificial nanolayers 106, such as SiGe sacrificial nanolayers, and active nanolayers 108, such as Si nanolayers, upon the upper substrate 102. The sacrificial nanolayers 106 can have Ge % ranging from 20% to 45%. In an implementation, the bottom most sacrificial nanolayer 106 may be epitaxially grown from the substrate 102 and the alternating active nanolayer 108 and sacrificial nanolayer 106 may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or formation," or the like, is defined herein as the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the disclosure, the active nanolayers 108 are formed from Si and can include, for example, monocrystalline Si. The active nanolayers 108 can have a thickness of, for example, from about 4 to about 12 nm. In embodiments the sacrificial nanolayers 106 are formed from SiGe and the sacrificial nanolayers 106 can have a thickness of, for example, from about 4 to about 12 nm. The sacrificial nanolayers 106 can have Ge % ranging from 20% to 45%. In some embodiments, the sacrificial nanolayers 106 are formed of a material that is sufficiently different from the active nanolayers 108, such that the sacrificial nanolayers 106 can be selectively removed without also removing the active nanolayers 108, and/or vice versa.

Further, in the depicted fabrication stage, one or more nanolayer stack(s) 120 are patterned. The one or more nanolayer stack(s) 120 may be patterned by forming a mask layer (not shown) that may be used to pattern the nanolayers into nanolayer stacks 120, upon the top nanolayer. The mask layer may be patterned by photolithography which resultantly exposes portions of the underlying top nanolayer while protects other portions of the underlying nanolayers.

The one or more nanolayer stack(s) 120 may be patterned by removing respective undesired portion(s) or section(s) of the sacrificial nanolayers 106 and active nanolayers 108 while retaining respective desired portions thereof. The removal of undesired portions of the sacrificial nanolayers 106 and active nanolayers 108 can be accomplished using, for example, etch processes. The desired portions of the sacrificial nanolayers 106 and active nanolayers 108 may be protected by the patterned mask layer and resultingly form the one or more nanolayer stack(s) 120, which may be in different and parallel planes to the page that exist into an/or out of the page.

Further, in the depicted fabrication stage, one or more sacrificial gate structures 134 are formed upon the upper substrate 102 and upon and around the one or more nanolayer stacks 120. Sacrificial gate structure(s) 134 may include a sacrificial gate liner (not shown), a sacrificial gate 136, and a sacrificial gate cap 138.

The sacrificial gate structure(s) 134 may be formed by depositing a sacrificial gate liner layer (e.g., a dielectric, oxide, or the like) upon the upper substrate 102 and upon and around the one or more nanolayer stacks 120. The sacrificial gate structure(s) 134 may further be formed by subsequently depositing a sacrificial gate layer (e.g., amorphous silicon, or the like) upon the sacrificial gate liner layer. The thickness of the sacrificial gate layer may be greater than the height of the one or more nanolayer stacks 120. The sacrificial gate structure 134 may further be formed by forming a gate cap layer upon the sacrificial gate layer. The gate cap layer may be formed by depositing a mask material, such as a hard mask material, such as silicon nitride, silicon oxide, combinations thereof, or the like. The gate cap layer may be composed of one or more layers of masking materials to protect the sacrificial gate layer and/or other underlying materials during subsequent processing of semiconductor IC device 100.

The sacrificial gate structure 134 may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate 136, and the sacrificial gate cap 138, respectively, of each of the one or more sacrificial gate structures 134.

One or more sacrificial gate structure(s) 134 can be formed on targeted regions or areas of semiconductor IC device 100 to define the length of one or more GAA FETs, one or more GAA FET channels, or the like, and to provide sacrificial material for yielding targeted GAA FET structure(s) in subsequent processing. According to an example, each sacrificial gate structure 134 can have a height of between approximately 50 nm and approximately 200 nm, and a length of between approximately 10 nm and approximately 200 nm.

One or more of the sacrificial gate structure 134 can be formed upon respective top, front, and rear sides (e.g., out of the front of the paper, out of the back of the paper) of the one or more nanolayer stacks 120, as depicted.

Figure 4:
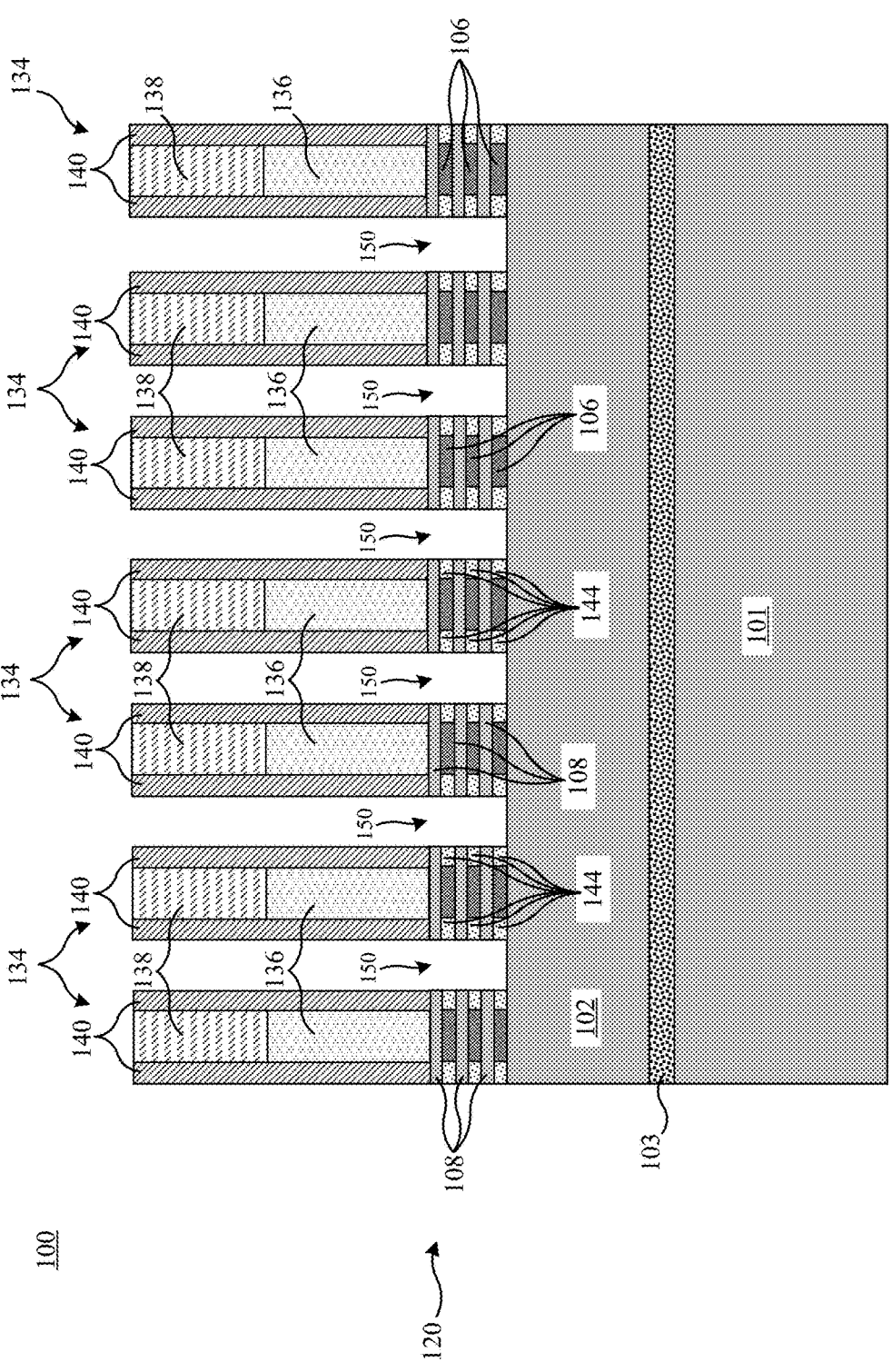

FIG. 4 depicts cross-sectional views of semiconductor IC device 100 shown after exemplary fabrication operation(s), in accordance with one or more embodiments. In the depicted fabrication stage, one or more spacer(s) 140 may be formed around each of the one or more sacrificial gate structure(s) 134. Further in the depicted fabrication stage, source/drain (S/D) recesses 150 are formed within the one or more nanolayer stack(s) 120 between spacers 140 that are associated with neighboring sacrificial gate structures 134, thereby separating or isolating the one or more nanolayer stack(s) 120. Further in the depicted fabrication stage, sacrificial nanolayers 106 within the one or more nanolayer stack(s) 120 may be indented, thereby forming an indent void underneath the one or more spacer(s) 140, and an inner spacer 144 may be formed within each respective indent void.

In the depicted fabrication stage, the spacer(s) 140 may be respectively formed upon substrate 102, may be formed upon and around nanolayer stacks 120, and may be formed upon and around the one or more sacrificial gate structure(s) 134. In one example, as depicted, spacers 140 may be formed of a dielectric material(s), such as such as silicon nitride, SiBCN, SiNC, SiN, SiCO, SiNOC, or a combination thereof.

Spacer(s) 140 may be formed by a deposition of a blanket dielectric material and excess, undesired, and/or exposed dielectric material may be subsequently removed by a substrative removal technique, such as an etch. For example, a directional etch may remove horizontal portion(s) of the blanket dielectric material while vertical portion(s) of the blanket dielectric material upon the sidewalls of the one or more sacrificial gate structure(s) 134 may be retained.

Further, in the depicted fabrication stage, source/drain (S/D) recesses 150 are formed within the one or more nanolayer stack(s) 120 between spacers 140 that are associated with neighboring sacrificial gate structures 134, thereby separating or isolating one or more of the nanolayer stack(s) 120, respectively.

The one or more S/D recesses 150 may be formed between sacrificial gate structures 134 by removing sacrificial nanolayer(s) 106 and by removing active nanolayer(s) 108 that are between spacer(s) 140 of adjacent or neighboring sacrificial gate structures 134. The one or more S/D recesses 150 may be formed to a depth so as to stop at the upper substrate 102. In this manner, a respective nanolayer stack 120 is diced or separated and respective portions of the sacrificial nanolayer(s) 106 and active nanolayer(s) 108 that are located below the spacer(s) 140 and below the sacrificial gate structure(s) 134 are retained.

The one or more S/D recesses 150 may be formed by removing undesired portions of the nanolayers, removing the portions of the nanolayers that are that are not protected by sacrificial gate structure 134 and/or by spacer(s) 140, or the like. These undesired portions of the nanolayers may be removed by etching or other subtractive removal techniques. The top surface of the upper substrate 102 may be used as an etch stop or other etch parameters may be controlled to stop the material removal at the upper substrate 102. The retained one or more portions of one or more nanolayer stacks 120 may be such portions thereof that were protected generally below and internal to a sacrificial gate structure 134 and/or by the associated spacer(s) 140.

Further in the depicted fabrication stage, sacrificial nanolayers 106 within the one or more nanolayer stacks 120 may be indented, thereby forming an indent void underneath the respective spacer 140, and an inner spacer 144 may be formed within a respective indent void.

The indent voids underneath respective spacer(s) 140 may be formed by a directional reactive ion etch (RIE) process, which can remove or indent portions of the sacrificial nanolayers 106 that are not covered by the sacrificial gate 136 and/or that are under the spacer(s) 140. The RIE can use a boron-based chemistry or a chlorine-based chemistry, for example, which selectively recesses the exposed portions sacrificial nanolayers 106 (e.g., those portions of sacrificial nanolayers 106 generally below spacer(s) 140, etc.) without significantly removing the active nanolayers 108.

Subsequently, a respective inner spacer 144 may be deposited in the recess or indent that was previously formed into the respective sacrificial nanolayer 106. In certain embodiments, the material of the inner spacer 144 is a dielectric material such as SiN, SiO, SiBCN, SiOCN, SiCO, etc. In certain embodiments, after the formation of the inner spacers 144, an isotropic etch process is performed to create outer vertical edges or sidewalls of the inner spacers 144 that are coplanar or align with outer vertical edges or sidewalls of the active nanolayers 108.

Figure 5:
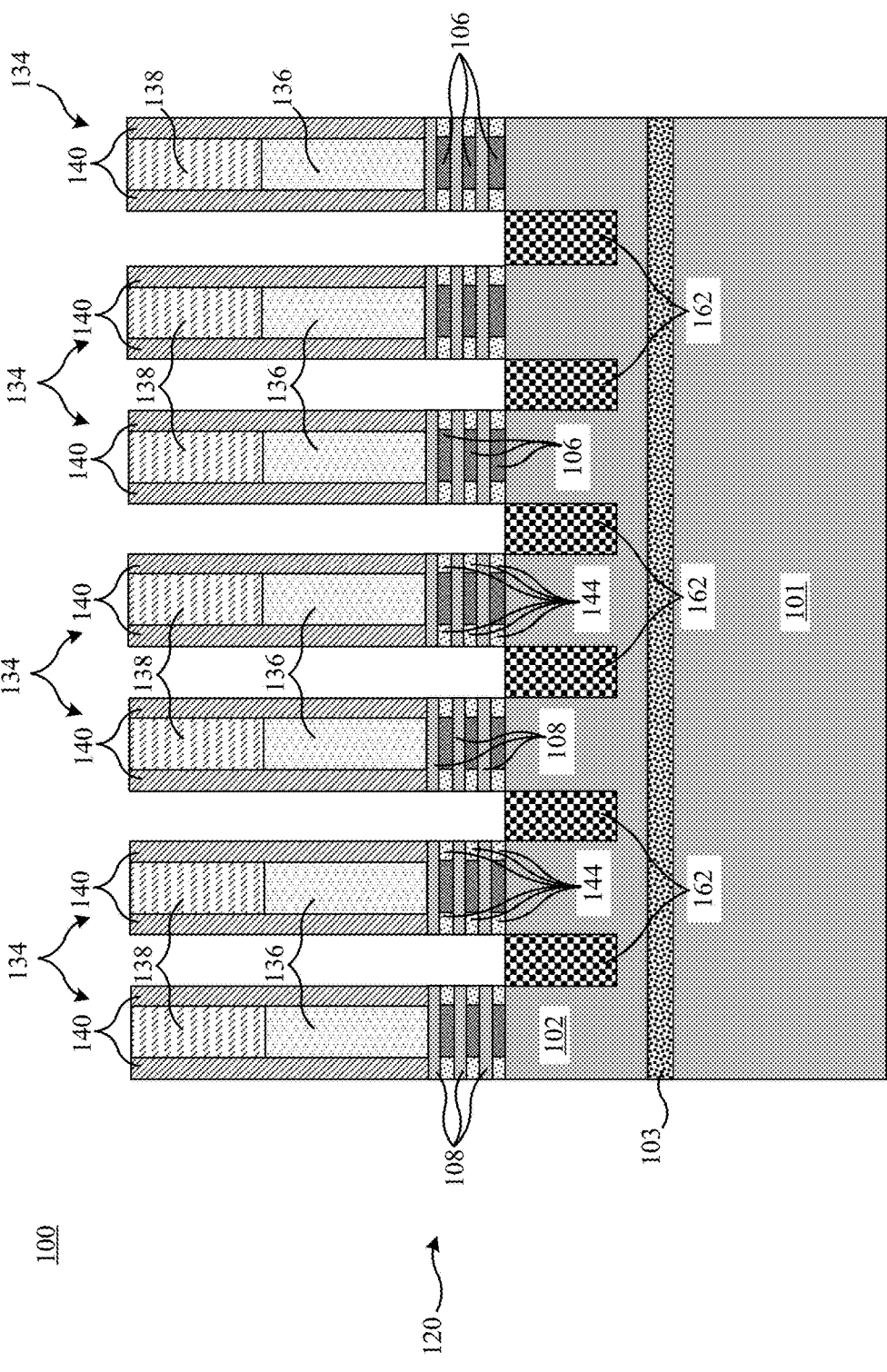

FIG. 5 depicts cross-sectional views of semiconductor IC device 100 shown after exemplary fabrication operation(s), in accordance with one or more embodiments. In the depicted fabrication stage, one or more backside contact placeholder(s) 162 are formed within upper substrate 102.

The one or more backside contact placeholder(s) 162 may be formed by initially forming one or more backside contact placeholder(s) cavities within the substrate generally in between adjacent sacrificial gate structures 134 and underneath respective S/D locations. For example, the one or more backside contact placeholder(s) cavities may be formed by a subtractive removal technique, such as an etch, that removes associated portion(s) of the upper substrate 102. The etch may be timed or otherwise controlled to stop the removal of the upper substrate 102 such that the depth or bottom of the one or more backside contact placeholder(s) cavities is above the etch stop layer 103, as depicted.

The one or more backside contact placeholder(s) 162 may be further formed by epitaxially growing an epitaxial material from exposed substrate 102 surface(s) within the one or more backside contact placeholder(s) cavities. In some embodiments, epitaxial growth and/or deposition processes may be selective to forming on the semiconductor surfaces of the upper substrate 102, and may not deposit material on dielectric surfaces, such as silicon dioxide or silicon nitride surfaces. In some embodiments, the one or more backside contact placeholder(s) 162 epitaxial growth may overgrow above the top surface of upper substrate 102. In an example, the epitaxial material of the one or more backside contact placeholder(s) 162 may be chosen to be etch selective to the material of the S/D region(s) 164, depicted in FIG. 6, the material of the upper substrate 102, or the like. In an example, the one or more backside contact placeholder(s) 162 may be bounded on each side by the upper substrate 102, as depicted.

Figure 6:
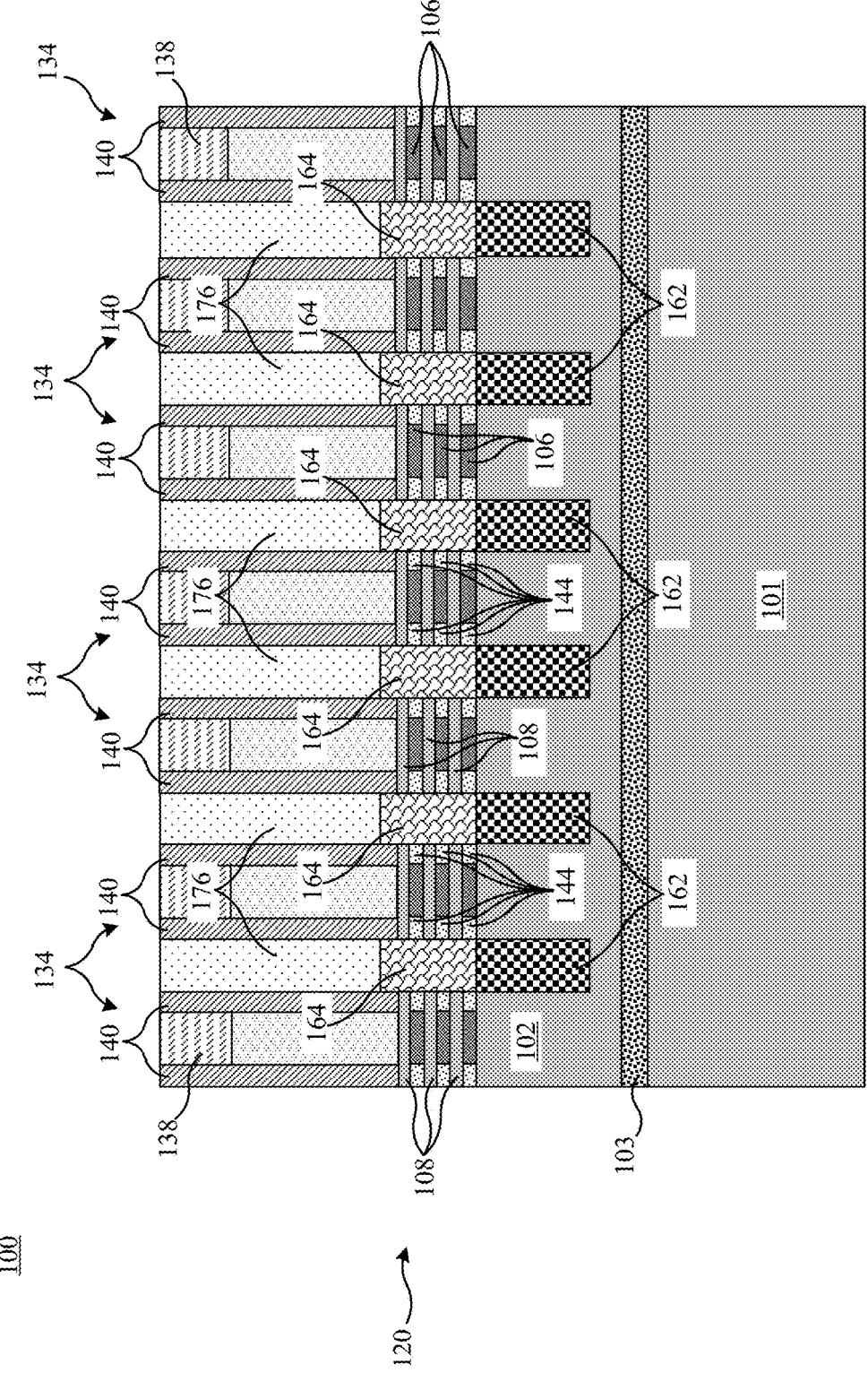

FIG. 6 depicts cross-sectional views of semiconductor IC device 100 shown after exemplary fabrication operation(s), in accordance with one or more embodiments. In the depicted fabrication stage, a S/D region 164 is formed upon a respective backside contact placeholder 162 and an inter-layer dielectric (ILD) 176 is formed upon the S/D regions 164.

The S/D regions 164 are formed of a material that can form either a source or a drain, respectively, to a GAA FET (i.e., those FETs in which the source or drain is connected to the active nanolayers 108 channels). S/D regions 164 may be epitaxially grown or formed. The S/D regions 164 may be formed by epitaxially growing epitaxial material upon a respective backside contact placeholder 162 within a source/drain region between neighboring GAA FETs and/or between neighboring sacrificial gate structure(s) 134.

In some embodiments, the S/D regions 164 epitaxial growth may overgrow well above the upper surface of the topmost nanolayer within the one or more nanolayer stacks 120. For example, the S/D regions 164 epitaxial may be initially grown above the top surface of the sacrificial gate structures 134. Subsequently, the S/D regions 164 may be etched back. The etch may be timed or otherwise controlled to stop the removal of S/D regions 164 such that the top surface(s) thereof are above the upper surface of the topmost active nanolayer 108.

In some examples, S/D regions 164 are formed by in-situ doped epitaxial growth. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into S/D regions 164. Other doping techniques can be used to incorporate dopants in the S/D regions 164. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in the S/D regions 164 can be in the range of $1\times10^{19}$ cm−3 to $2\times10^{21}$ cm−3, or preferably between $2\times10^{20}$ cm−3 to $7\times10^{20}$ cm−3.

Further, in the depicted fabrication stage ILD 176 is formed upon and around the S/D regions 164, upon spacer(s) 140, or the like. The ILD 176 can be any suitable material, such as, for example, porous silicates, carbon doped oxides, silicon dioxides, silicon nitrides, silicon oxynitrides, or other dielectric materials. The ILD 176 can be formed using, for example, CVD, PECVD, ALD, flowable CVD, spin-on dielectrics, or PVD. In an example, the ILD 176 may be formed to a thickness above the top surface of the semiconductor IC device 100 and subsequently etched back such that the top surface of the ILD 176 is coplanar with a top surface of the gate hard mask 118 and/or a top surface of spacer(s) 140. In another example, after deposition of the ILD 176 a planarization process, such as a chemical mechanical polish (CMP), may be performed to create a planar upper surface for the semiconductor IC device 100. For example, respective top surfaces of the ILD 176, spacer(s) 140, and sacrificial gate cap 138 may be horizontally coplanar.

Figure 7:
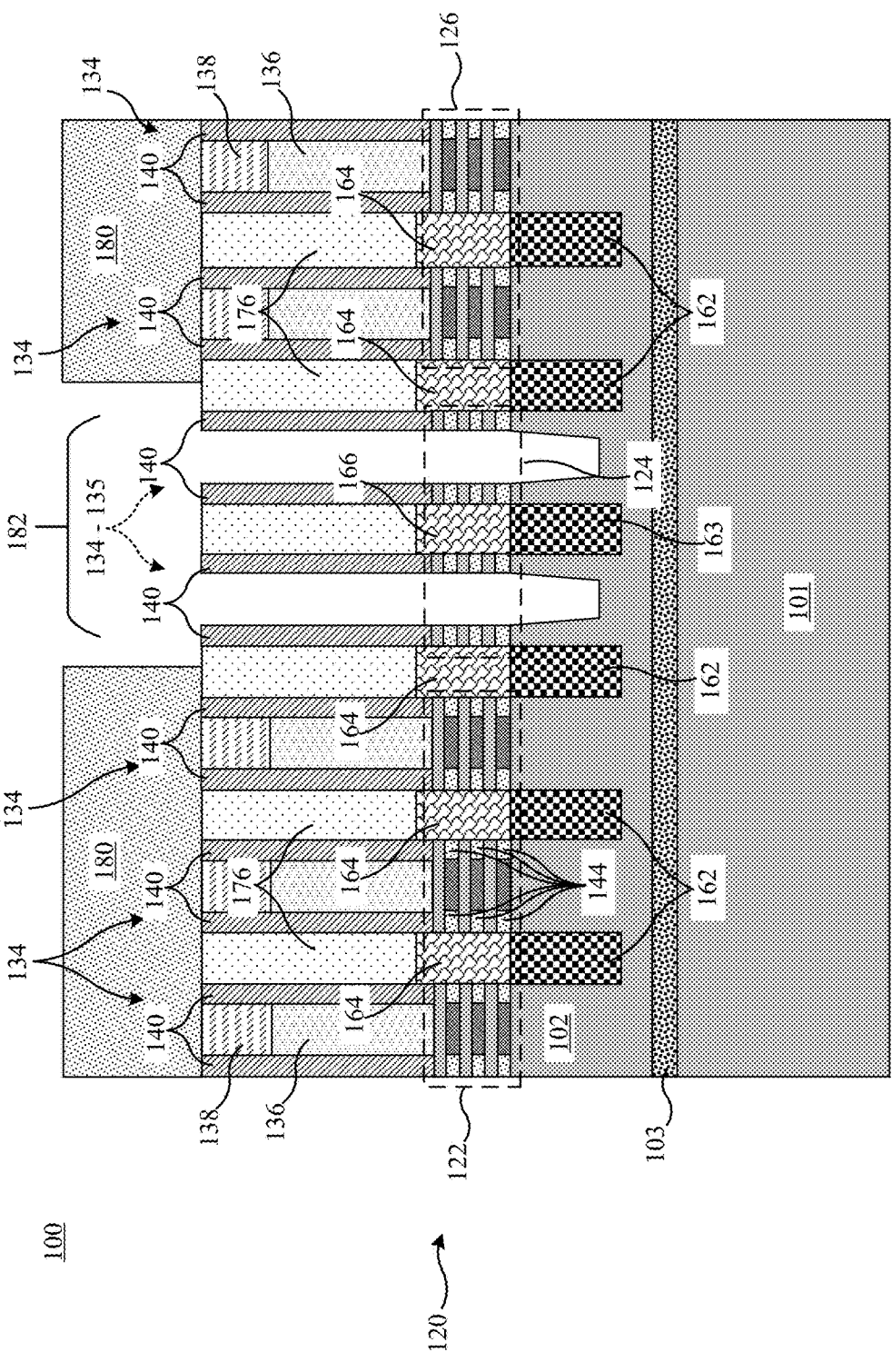

FIG. 7 depicts cross-sectional views of semiconductor IC device 100 shown after exemplary fabrication operation(s), in accordance with one or more embodiments. In the depicted fabrication stage, mask 180 is formed and patterned to at least partially define DDB region(s) 182, the sacrificial gate structures 134 within DDB region(s) 182 are removed, and the active nanolayers 108 and the sacrificial nanolayers 106 within DDB region(s) 182 are removed.

The mask 180 may be formed by depositing a blanket mask layer, consisting of a dielectric material or other mask material, upon the respective top surfaces of the spacer(s) 140, the sacrificial gate structure(s) 134, ILD 176, and/or the like. Using lithography and etching techniques the blanket mask layer opened or patterned in predetermined location(s) to at least partially define DDB region(s) 182 and the one or more neighboring active regions on one or more sides of the DDB region(s) 182 and may be retained over the neighboring active regions to protect the active regions there below. In other examples, the mask 180 may be formed directly, selectively, or, in other words, only over the neighboring active regions to protect the active regions there below. The mask 180 can be any suitable material, such as, for example, porous silicates, oxides, nitrides, silicon oxynitrides, OPL, or other dielectric materials. Any known manner of forming the mask 180 can be utilized. For example, the mask 180 can be formed using, for example, CVD, PECVD, ALD, flowable CVD, spin-on dielectrics, PVD, or the like.

Using the mask 180 to protect the underlying active region(s) adjacent to DDB region(s) 182, the sacrificial gate structure(s) 134, the active nanolayers 108, and the sacrificial nanolayers 106, and a portion of the upper substrate 102 are removed by an appropriate substrative removal technique, such as an etch. The etch may be timed or otherwise controlled to remove the material of the sacrificial gate structure(s) 134, the active nanolayers 108, and the sacrificial nanolayers 106, and a portion of the upper substrate 102 and retain the respective materials of the ILD 176, spacer(s) 140, or the like.

The sacrificial gate structures 134 within DDB region(s) 182 may be removed by selectively removing associated portions of sacrificial gate cap 138, sacrificial gate 136, and sacrificial gate oxide (if present) while retaining the spacers 140. Next, the sacrificial nanolayers 106 and active nanolayers 108 within DDB region(s) 182 may be removed by selectively removing nanolayers 106 and active nanolayers 108 while retaining portions of both the inner spacers 144 and the active nanolayer 108 that are below spacers 140. Next, portion(s) of the upper substrate 102 that are within DDB region(s) 182 may be removed by timing or otherwise controlling the removal of the material of the upper substrate 102 such that the bottom or well of the forming trench is above the etch stop layer 103, is above the bottom surface of contact placeholder(s) 162, or the like. For example, the depth of the well that is formed within upper substrate 102 within DDB region(s) 182 may be to a depth within the upper substrate 102 for the DDB region(s) 182 to adequately electrically isolate the adjacent active regions. The depth of the well that is formed within upper substrate 102 within DDB region(s) 182 may be to a depth generally above the bottom surface of contact placeholder(s) 162 to allow for backside contact opening formation or access to the placeholder(s) 162 within the active region(s) adjacent to the DDB region(s) 182.

Removal of these features may be accomplished by an etching process which may include a dry etching process such as RIE, plasma etching, ion etching or laser ablation. The etching can further include a wet chemical etching process(es). The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Subsequently, the mask 180 may be removed by a subtractive removal technique, such as an etch, OPL ash, or the like.

Upon removal of the sacrificial gate structures 134, the active nanolayers 108, the sacrificial nanolayers 106, and associated trench portion(s) of the upper substrate 102 within DDB region(s) 182 generally form DDB trench(es) 135. Further, the removal of the sacrificial gate structures 134, the removal of active nanolayers 108, the removal of sacrificial nanolayers 106, and/or the removal of associated trench portion(s) of the upper substrate 102 effectively changes or otherwise transforms S/D region 164 within the DDB region(s) 182 into faux S/D region 166. The term "faux S/D region" is defined herein to mean a structure of material that is not used as a source or a drain of a transistor and that structurally (e.g., same dimensions, or the like) and materially (e.g., same material, or the like) mirrors a different instance of material that is in a different location that is used to as a source or the drain of a functional or working transistor. Similarly, as the DDB region(s) 182 are at least partially and presently defined, the backside contact placeholder(s) 162 within the DDB region(s) 182 are now referred herein as DDB backside contact placeholder(s) 163.

Further, the removal of the sacrificial gate structures 134, the removal of active nanolayers 108, the removal of sacrificial nanolayers 106, and/or the removal of associated trench portion(s) of the upper substrate 102 effectively changes the remaining portions of the segmented nanolayer stack(s) 120 within the DDB region(s) 182 (e.g., portions of the active nanolayers 108, or the like) into faux channels. The term "faux channel" is defined herein to mean a structure of material that is not used as a channel of a transistor and that at least mirrors a different instance of material (e.g., is the same and/or substantially the same material) that is in a different location that is used as a channel of a transistor that allows current to flow between the transistor source and drain.

Respective regions 122, 124, and 126 denote the distinction between faux channels and channels within the semiconductor IC device 100. Region 124 identifies the portions of active nanolayers 108 therewithin as being faux channels and the regions 122 and 126 identify the portions of active nanolayers 108 therewithin that are used as respective channels of a transistor. Particularly, as depicted, there may be a first set of one or more faux channels that connect diffusion break isolation rail 184, as depicted for example in FIG. 8, and faux S/D region 166 and there may be a second set of one or more faux channels that connect diffusion break isolation rail 186, as depicted for example in FIG. 8, and faux S/D region 166. Further, as depicted, there may be a third set of one or more faux channels that connect diffusion break isolation rail 184 and S/D region 164 and there may be a fourth set of one or more faux channels that connect diffusion break isolation rail 186 and S/D region 164.

Figure 8:
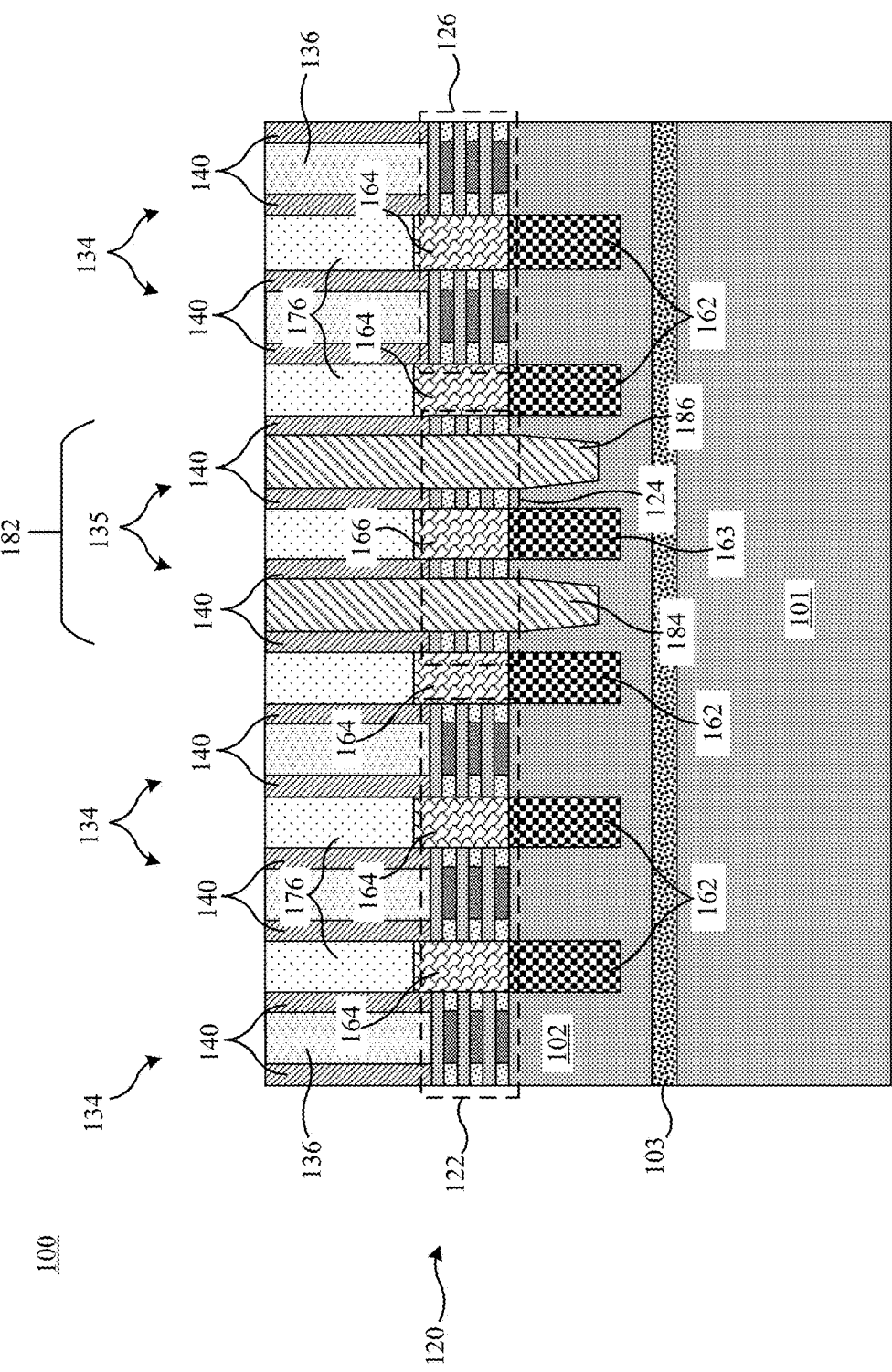

FIG. 8 depicts cross-sectional views of semiconductor IC device 100 shown after exemplary fabrication operation(s), in accordance with one or more embodiments. In the depicted fabrication stage, a diffusion break isolation rail 184 and a diffusion break isolation rail 186 are formed within a respective one of the DDB trench(es) 135.

The diffusion break isolation rails 184, 186 may be formed by depositing a blanket dielectric material within the DDB trench(es) 135 and upon the semiconductor IC device 100. The blanket dielectric material can be any suitable isolation material, such as, for example, porous silicates, oxides, nitrides, silicon oxynitrides, low-κ material (i.e., a material with a lower dielectric constant relative to $SiO_2$), or other dielectric isolation materials. Any known manner of forming the blanket dielectric material can be utilized, such as for example, CVD, PECVD, ALD, flowable CVD, spin-on dielectrics, PVD, or the like. Subsequently, a planarization process, such as a CMP process or a mechanical grinding process, may remove excess portions of the blanket dielectric material and may also remove any remaining sacrificial gate cap 138 material. As such, at the present fabrication stage, the respective top surfaces of spacer(s) 140, sacrificial gate(s) 136, ILD 176, diffusion break isolation rail 184, and diffusion break isolation rail 186 may be coplanar.

Figure 9:
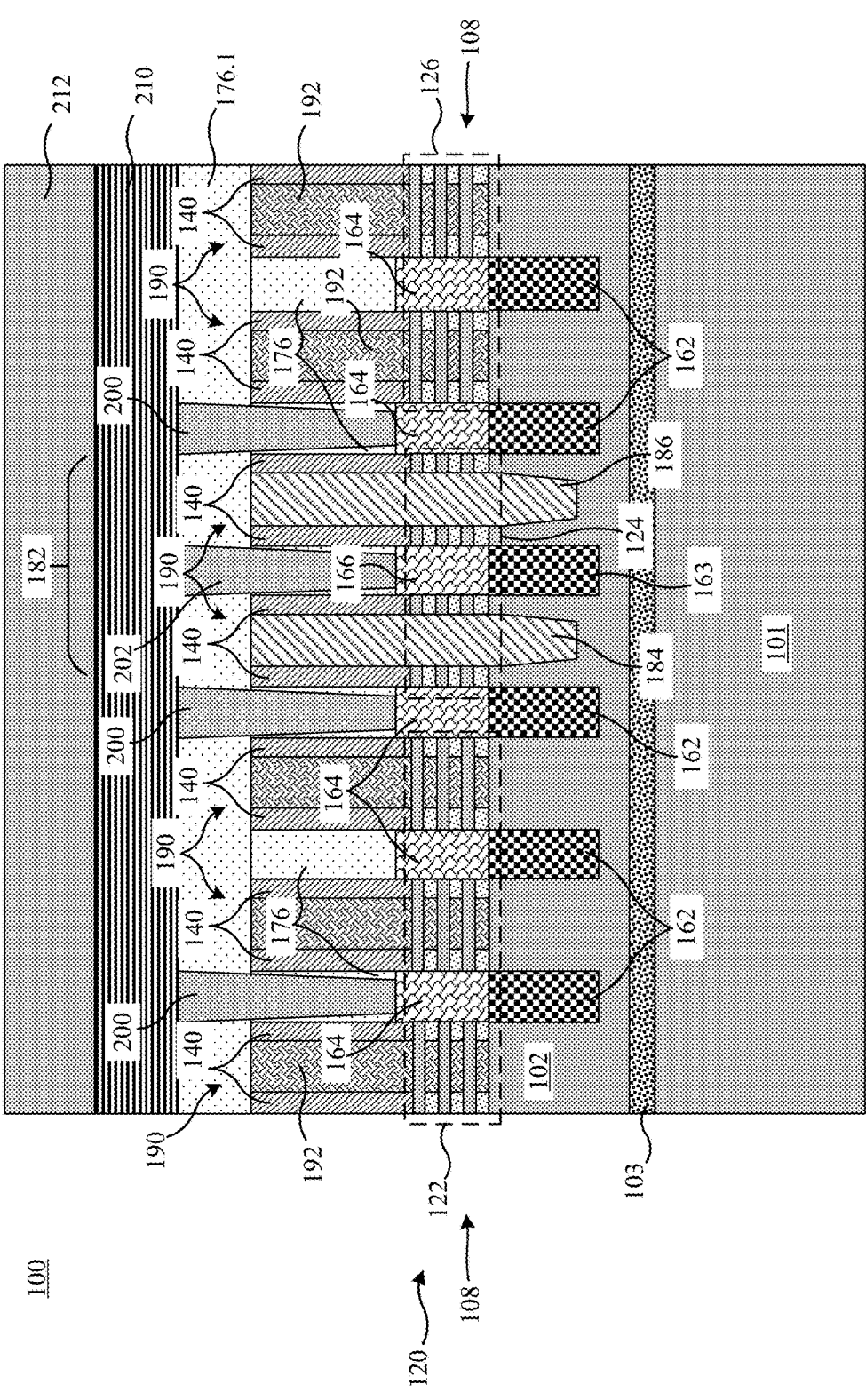

FIG. 9 depicts cross-sectional views of semiconductor IC device 100 shown after exemplary fabrication operation(s), in accordance with one or more embodiments. In the depicted fabrication stage, the sacrificial gate structures 134 and the sacrificial nanolayers 106 that are not located in DDB region(s) 182 are removed. Further in the depicted fabrication stage, replacement gate structures 190 are formed. Even further in the depicted fabrication stage, ILD 176.1 is formed, frontside contact(s) 200 within the active regions are formed, and frontside contact(s) 202 within the DDB region(s) 182 are formed. Still further in the depicted fabrication stage, frontside BEOL network 210 is formed and a carrier wafer 212 is bonded thereto.

The sacrificial gate structures 134 that are within the active regions may be removed by removing respective sacrificial gate 136, sacrificial gate oxide (if present), and the sacrificial nanolayers 106 associated therewith by a subtractive removal technique, such as one or more series of etches. For example, removal of these features may be accomplished by an etching process which may include a dry etching process such as RIE, plasma etching, ion etching or laser ablation. The etching can further include a wet chemical etching process(es).

After the removal of sacrificial nanolayers 106, void spaces between the neighboring semiconductor nanolayers 108 and/or upper substrate 102 are formed. It should be appreciated that during the removal of the sacrificial gate 136, the sacrificial oxide layer, the sacrificial nanolayers 106, and/or the like, appropriate etchants are used that do not significantly remove material of active semiconductor nanolayers 108, upper substrate 102, inner spacers 144, spacers 140, or the like. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

The replacement gate structure(s) 190 may be formed by initially forming an interfacial layer (not shown) on the interior surfaces of the spacer(s) 140, on the interior surfaces of the active nanolayers 108, on the inner spacers 140, on the upper substrate 102, or the like. A high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ material is a material with a higher dielectric constant than that of $SiO_2$, and can include e.g., LaO, AlO, ZrO, TiO, Ta2O5, Y2O3, SrTiO3(STO), BaTiO3 (BTO), BaZrO, HfZrO, HfLaO, HfSiO, LaSiO, AlSiO, HfTaO, HfTiO, BaSrTiO3 (BST), Al2O3, Si3N4, oxynitrides (SiON), or other suitable materials. The high-κ layer can include a single layer or multiple layers, such as metal layer, liner layer, wetting layer, and adhesion layer. In other embodiments, the high-κ layer can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure(s) 190 may be further formed by depositing a work function (WF) gate (not shown) upon the high-κ layer. The WF gate can be comprised of metals, such as, e.g., copper (Cu), cobalt (Co), aluminum (Al), platinum (Pt), gold (Au), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the work function (WF) gate sets the threshold voltage (Vt) of the transistors within the active regions. The high-κ layer may be between and separate the WF gate from the active nanolayers 108. The WF gate may be formed to a thickness to generally fill the gaps or voids between active nanolayers 108.

Replacement gate structure(s) 190 may be further formed by depositing a conductive fill gate 192 upon the WF gate. The conductive fill gate 192 can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 190 formation, the top surface of the semiconductor IC device 100 may be planarized by a planarization technique such as a CMP, mechanical grinding process, or the like.

The ILD 176.1 may be formed upon the top surface of ILD 176, upon the top surface of spacer(s) 140, upon the top surface of replacement gate structure(s) 190, and/or the like. The ILD 176.1 may be formed by depositing a dielectric material, such as, for example, porous silicates, carbon doped oxides, silicon dioxides, silicon nitrides, silicon oxynitrides, or other dielectric materials. Any known manner of forming the ILD 176.1 can be utilized. The ILD 176.1 can be formed using, for example, CVD, PECVD, ALD, flowable CVD, spin-on dielectrics, or PVD. The ILD 176.1 may be the same or different material relative to ILD 176.

Subsequently, front-side contact openings (not shown) are formed within ILD 176.1. The formation of front-side contact openings may include etching the ILD 176.1 to form the opening. A respective opening may expose at least a portion of a S/D region 164, at least a portion of faux S/D region 166, or the like.

Frontside contact(s) 200 within the active regions may be formed by depositing conductive material within the front-side contact openings that are within the active regions. Frontside contact(s) 202 within the DDB region(s) 182 may be formed by depositing conductive material within the front-side contact openings that are within the DDB region(s) 182. The formation of the frontside contacts 200, 202 may include forming a blanket conductive barrier layer extending into the front-side contact openings, depositing a metal or conductive material over the blanket conductive barrier layer, and performing a planarization process, such as a CMP process or a mechanical grinding process, to remove excess portions of the conductive barrier layer and the conductive material. Frontside contacts 200, 202 may consist of a liner formed of Ni, NiPt, Ti, TiN, TaN, etc. and a conductive fill thereupon, such as Al, Ru, W, Co, Cu, etc. In some implementations, the formation of frontside contacts 200, 202 may be a part of middle of the line (MOL) fabrication processes.

A respective frontside contact 202 contacts or otherwise melds to the exposed and associated portion of the faux S/D region 166 there below. Likewise, a respective frontside contact 200 located in an active region, contacts or otherwise melds to the exposed and associated portion of the S/D region 164 there below. The frontside contact 200 may be connected to a power rail within the BEOL network 210 and may provide power potential (VDD, VSS, or the like) to the S/D region 164 there below.

In the active regions, another respective frontside contact (not shown) may contact otherwise meld to the exposed and associated replacement gate structure 190 there below. This front side gate contact may be further connected to a signal line within the frontside BEOL network 210 and electrically carry a functional or logical potential or signal that is to change or is otherwise dynamic over time. Such functional or logical potential or signal may determine whether the associated transistor is on or off.

Frontside BEOL network 210 include conductive wires or traces within different metallization levels, associated metallization dielectric or passivation layers, vertical vias that connect predetermined conductive wires or traces within the metallization levels with an underlying device or structure, and/or conductive I/O pads, or the like. A signal line is defined herein as a conductive feature, such as a wire, trace, or the like, that is configured to electrically carry a functional or logical potential or signal that is to change or is otherwise dynamic over time. A power rail is defined herein as a conductive feature, such as a wire, trace, plane, or the like, that is configured to electrically carry a logical potential that does not change over time.

In some examples, there may be five metal levels M0-M4 within frontside BEOL network 210. In some examples, there may be more than ten metal levels within BEOL network 210. In some examples, frontside contact 200 may contact and connect the respective S/D region 164 there below to a via, signal line, power rail, or the like, located within the lowest BEOL metal level M0. Likewise, frontside contact 202 may contact and connect the respective faux S/D region 166 there below to a via, signal line, power rail, or the like, located within the lowest BEOL metal level M0.

Generally, the frontside BEOL network 210 are located on the frontside of the semiconductor IC device 100. Upon completion of the frontside BEOL network 210, carrier wafer 212 may be bonded or otherwise attached to the top surface of BEOL network 210, as depicted. Carrier wafer 212 may be attached to semiconductor IC device 100 by any carrier bonding technique.

Figure 10:
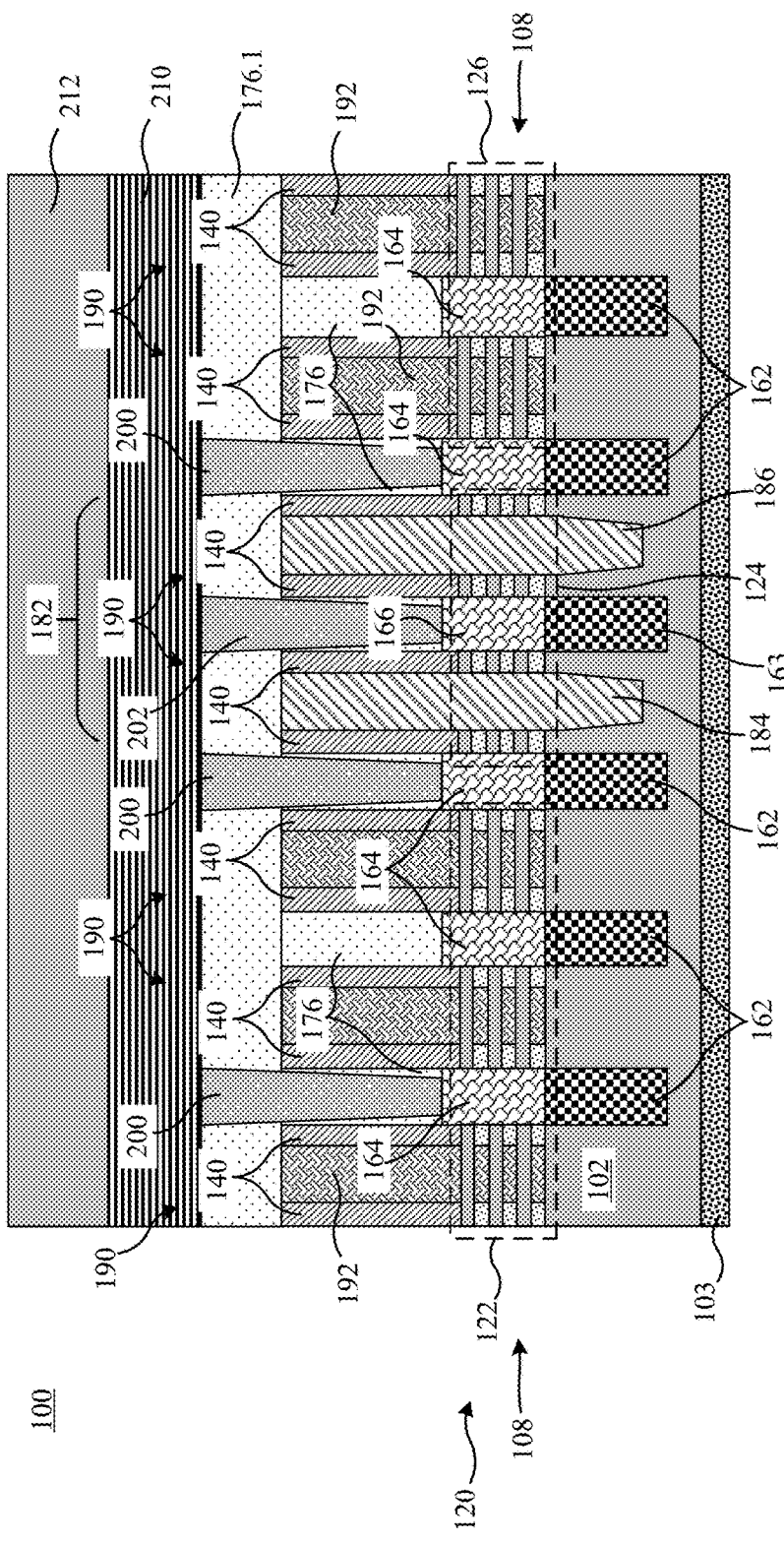

FIG. 10 depicts cross-sectional views of semiconductor IC device 100 shown after exemplary fabrication operation(s), in accordance with one or more embodiments. In the depicted fabrication stage, semiconductor IC device 100 is flipped (not shown) and lower substrate 101 is removed. The lower substrate 101 may be removed by any removal technique, such as a combination of wafer grinding, CMP, dry, and/or wet etch. In the example depicted, lower substrate 101 is removed by an etch that utilizes etch stop layer 103 as the etch stop. In this example, removal of lower substrate 101 exposes the bottom surface of etch stop layer 103.

Figure 11:
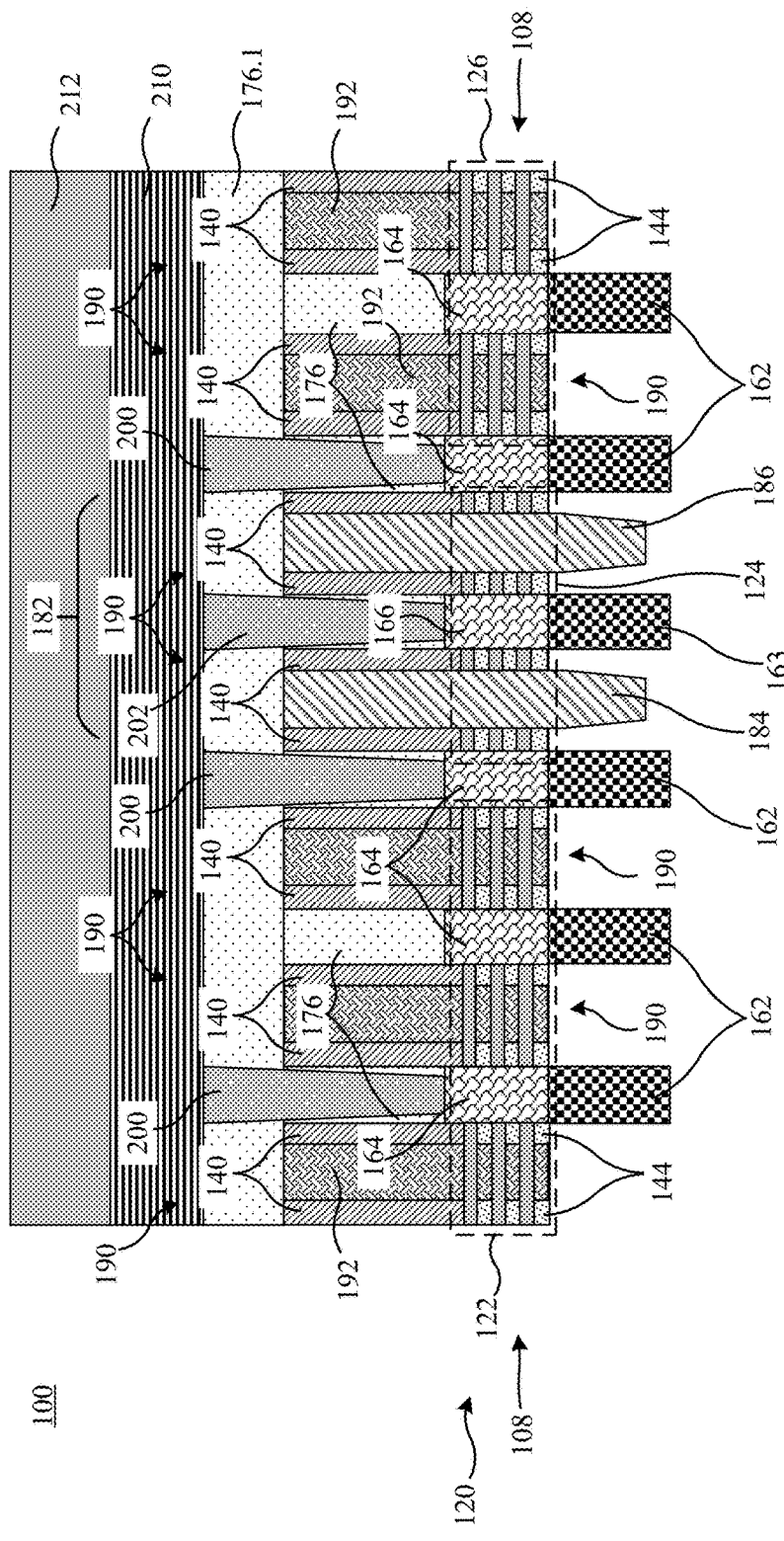

FIG. 11 depicts cross-sectional views of semiconductor IC device 100 shown after exemplary fabrication operation(s), in accordance with one or more embodiments. In the depicted fabrication stage, etch stop layer 103 and upper substrate 102 is removed.

The etch stop layer 103 may be removed by a subtractive removal technique such as a CMP, dry and/or wet etch. Upon removal of the etch stop layer 103, the bottom surface (as depicted) upper substrate 102 is exposed. The removal of etch stop layer 103 may be selective to the material of upper substrate 102. For example, etch stop layer 103 is removed by an etch that utilizes upper substrate 102 as the etch stop.

Subsequently, the upper substrate 102 is removed by an appropriate substrative removal technique, such as an etch, that removes associated portion(s) of the upper substrate 102. The etch may be timed or otherwise controlled to remove the material of substrate 102 and retain or otherwise expose the backside contact placeholder(s) 162 and backside contact placeholder(s) 163, retain and partially expose the diffusion break isolation rail 184 and diffusion break isolation rail 186, and retain and expose at least the respective bottom surfaces (as depicted) of replacement gate structure(s) 190 and inner spacers 144.

Figure 12:
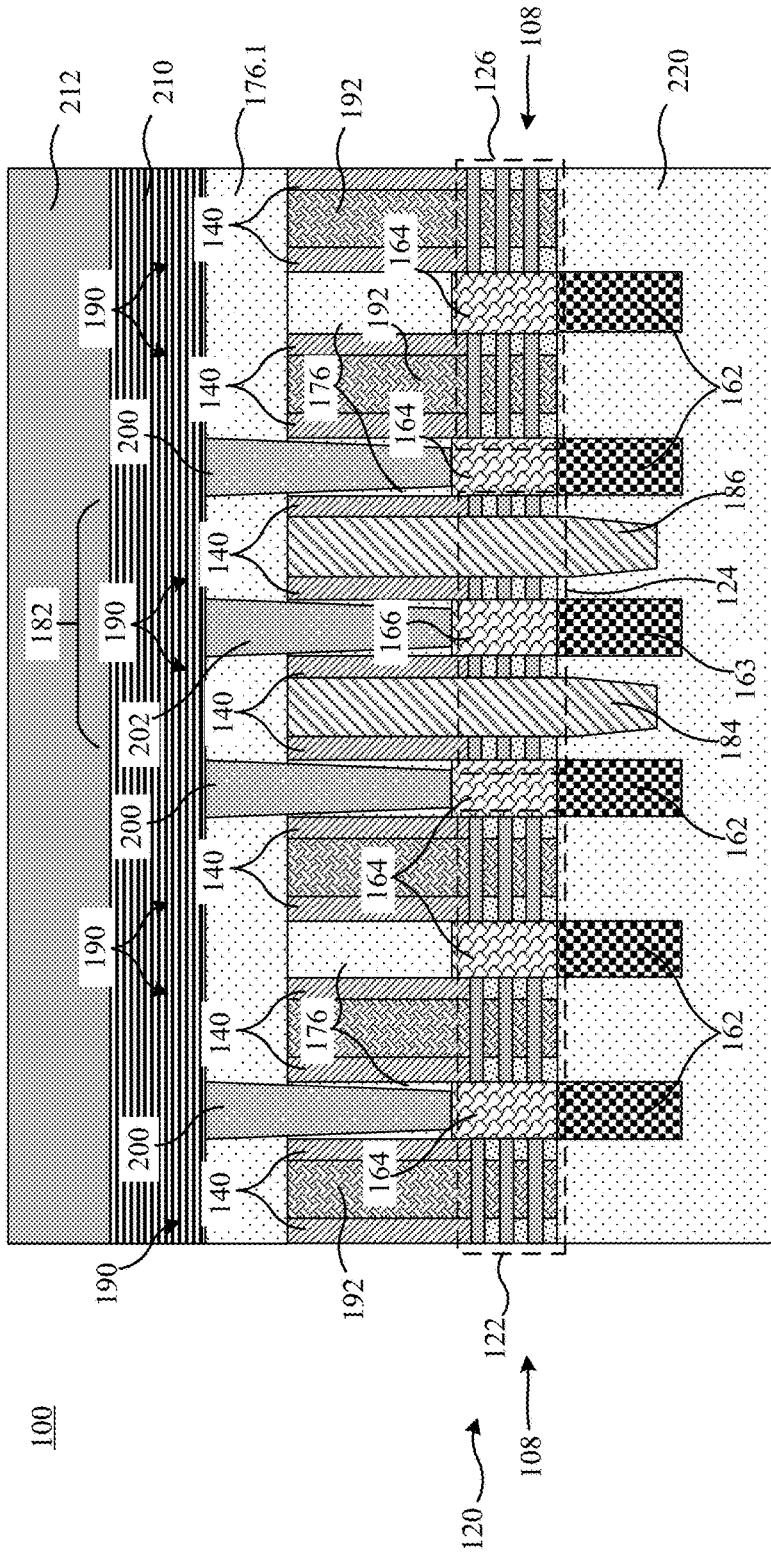

FIG. 12 depicts cross-sectional views of semiconductor IC device 100 shown after exemplary fabrication operation(s), in accordance with one or more embodiments. In the depicted fabrication stage, ILD 220 is formed upon the exposed backside of the semiconductor IC device 100. The ILD 220 may be formed upon and around the exposed backside contact placeholder(s) 162 and backside contact placeholder(s) 163, formed upon and around the partially exposed diffusion break isolation rail 184 and diffusion break isolation rail 186, and formed upon the exposed surfaces of replacement gate structure(s) 190 and inner spacers 144. The ILD 220 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 220 can be utilized. The ILD 220 can be formed using, for example, CVD, PECVD, ALD, flowable CVD, spin-on dielectrics, or PVD.

Figure 13:
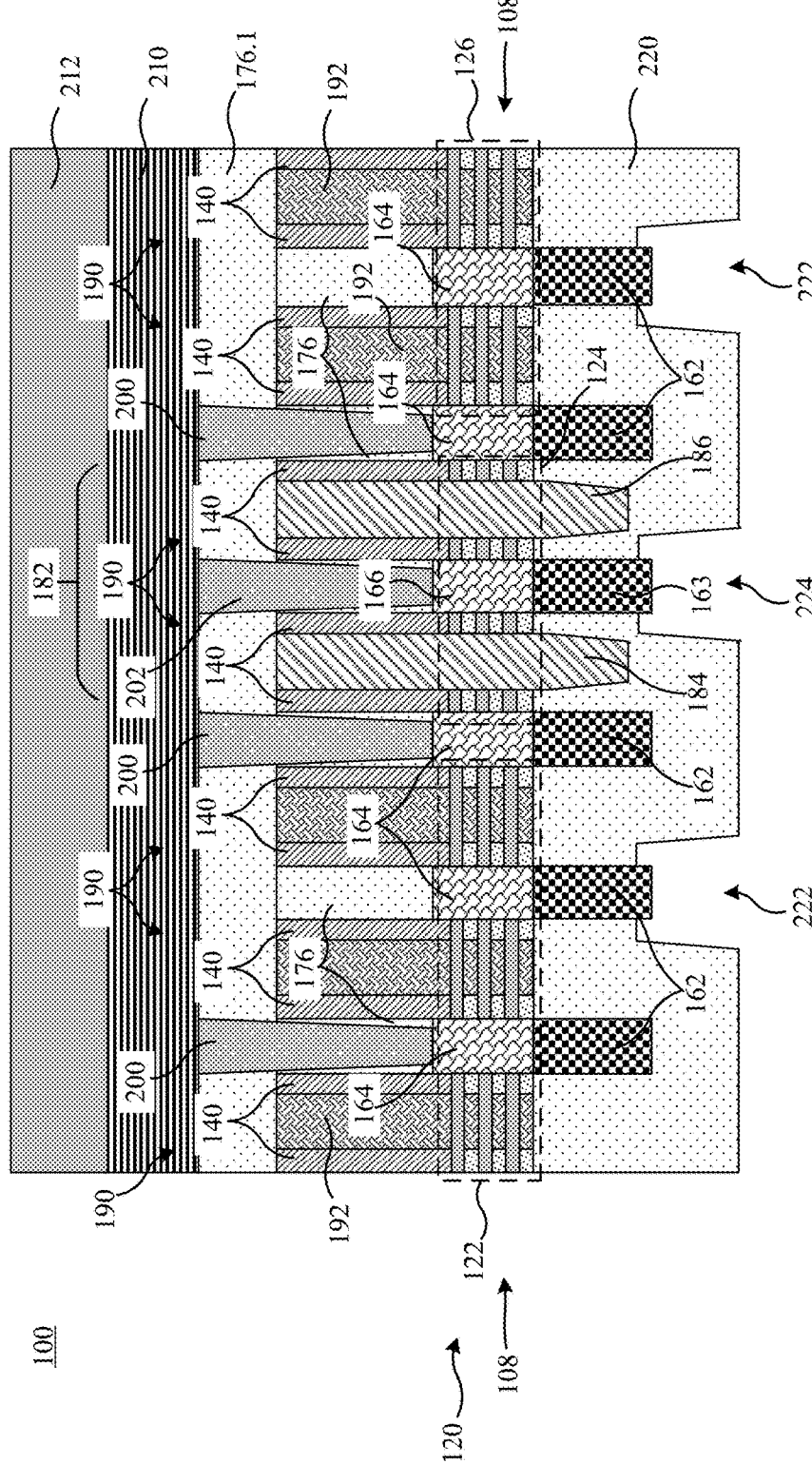

FIG. 13 depicts cross-sectional views of semiconductor IC device 100 shown after exemplary fabrication operation(s), in accordance with one or more embodiments. In the depicted fabrication stage, backside contact opening(s) 222 may be formed within the active regions and backside contact opening(s) 224 may be formed within the DDB region(s) 182.

The backside contact opening(s) 222 may be formed from the backside of the semiconductor IC device 100 through ILD 220 within the active regions and may expose a portion of the bottom surface and/or side surface(s) of a respective backside contact placeholder 162. Similarly, the backside contact opening 224 may be formed from the backside of the semiconductor IC device 100 through ILD 220 within the DDB region(s) 182 and may expose a portion of the bottom surface and/or side surface(s) of a respective backside contact placeholder 163.

The backside contact opening(s) 222 and/or 224 may be formed by a subtractive removal technique, such as an etch, that removes associated portion(s) of the ILD 220. The etch may be timed or otherwise controlled to stop the removal of the ILD 220 such that the depth or well of backside contact opening(s) 222 and/or 224 exposes the bottom and/or side surfaces of the associated backside contact placeholder 162, 163, respectively. The backside contact opening(s) 222 and/or 224 may be formed by the same or shared lithography and etch process, or sequential lithography and etch processes. In such process(es), a mask may be applied and patterned. An opening in the patterned mask may expose the portion of the underlying ILD 220 to be removed while other protected portions of semiconductor IC device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, and other suitable parameters and selective materials are utilized to promote the etchant for desired material removal.

Figure 15:
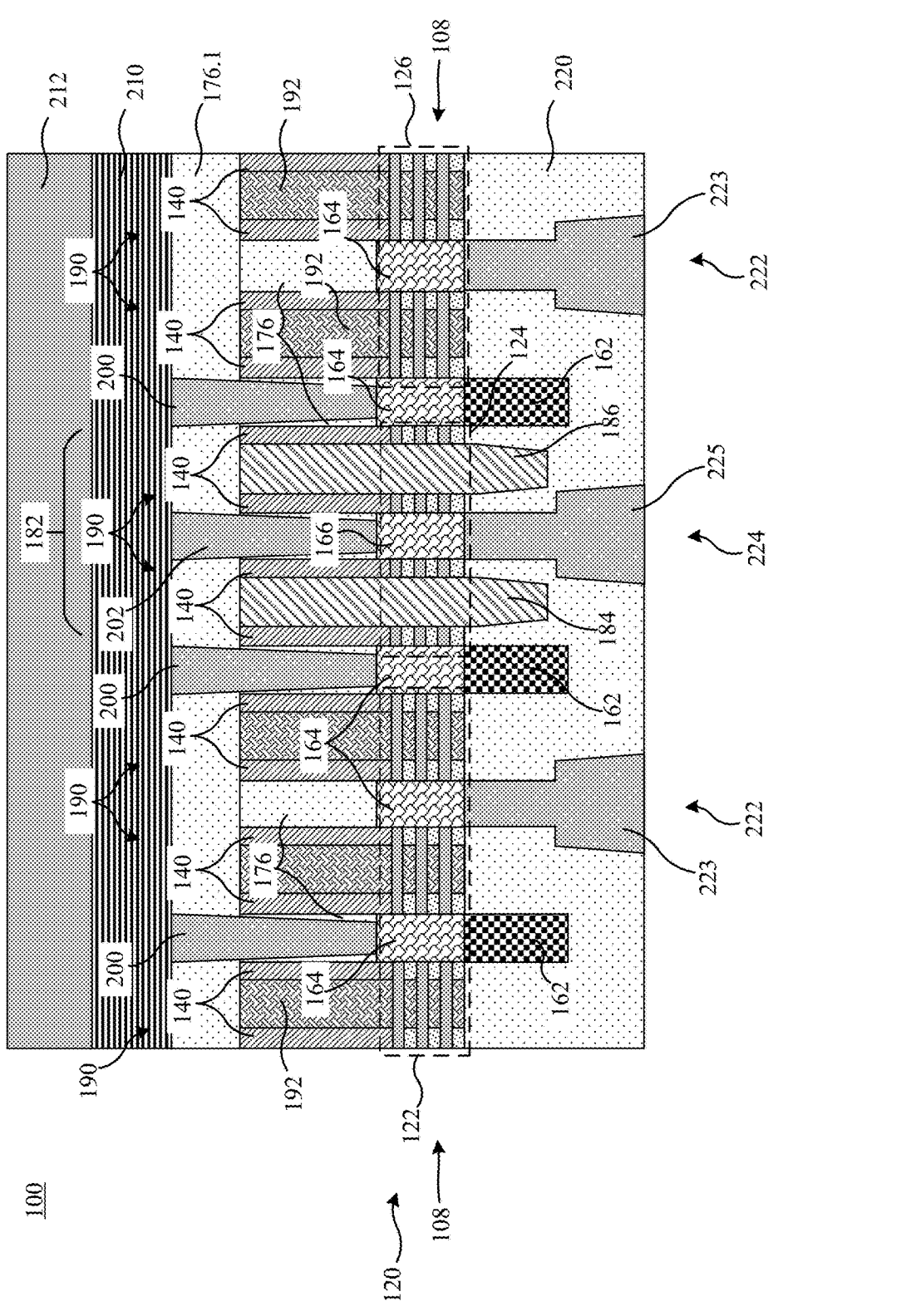

For clarity, in some examples as depicted, there are some sites where backside contact(s) are not formed in conjunction with an associated backside contact placeholder 162. In this example, it may be desirable for the backside contact placeholder 162 to be maintained in these sites. Particularly, for example, to reduce propensity of shorting between backside contact 225, as depicted in FIG. 15, and an adjacent replacement gate structure 190, it may be desirable to maintain the backside contact placeholder(s) 162 that are located immediately adjacent to the DDB region(s) 182. In other words, it may be desirable to maintain the backside contact placeholder(s) 162 that are located immediately adjacent to the diffusion break isolation rail 184 and desirable to maintain the backside contact placeholder(s) 162 that are located immediately adjacent to the diffusion break isolation rail 186.

Figure 14:
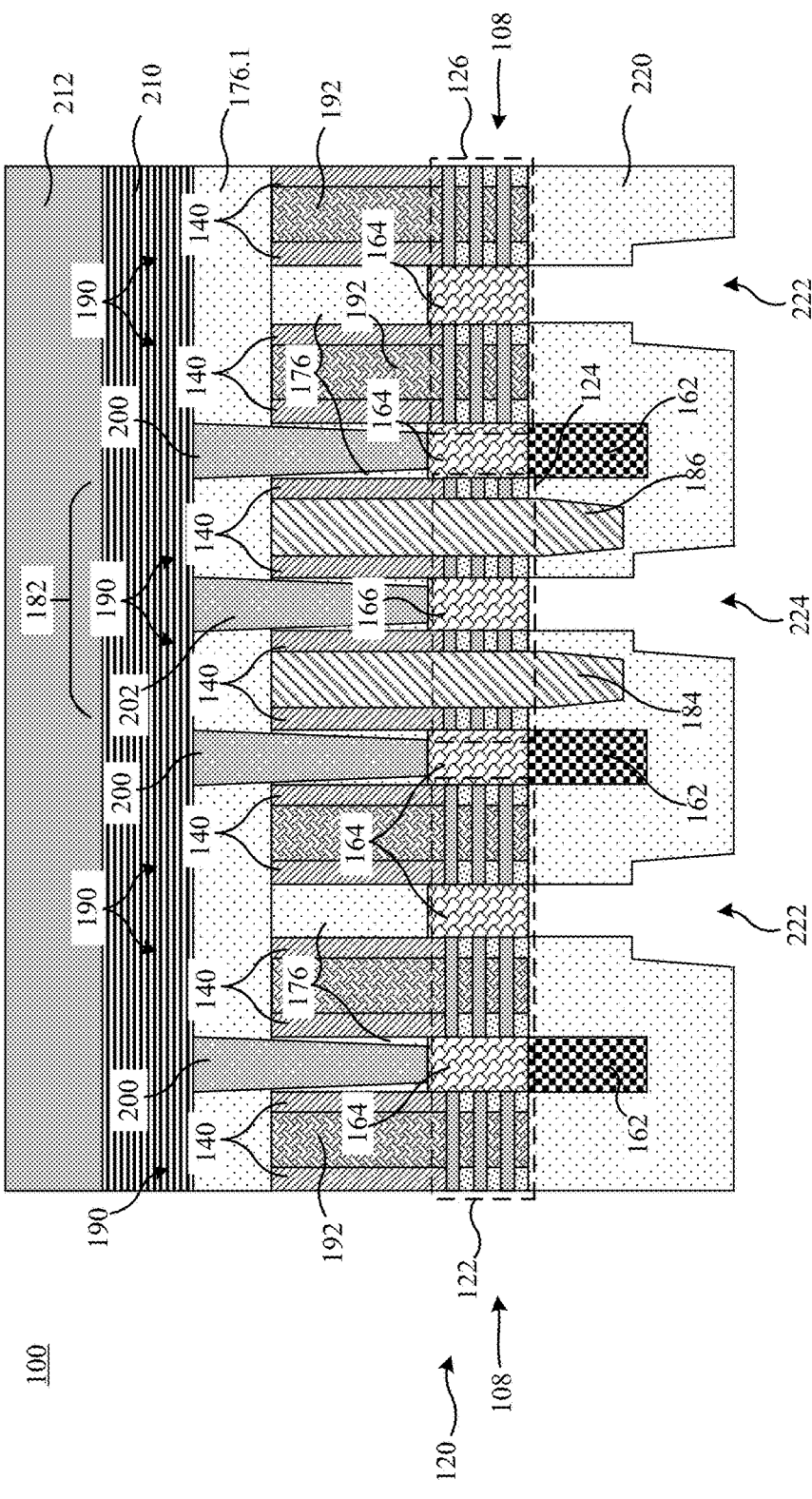

FIG. 14 depicts cross-sectional views of semiconductor IC device 100 shown after exemplary fabrication operation(s), in accordance with one or more embodiments. In the depicted fabrication stage, the backside contact placeholder(s) 162, 163 that are exposed by backside contact opening(s) 222 and/or 224 may be removed. Upon removal of the backside contact placeholder(s) 162 by a substrative removal technique, such as an etch, the S/D region 164 there above (as depicted) is at least partially exposed. Similarly, upon removal of the backside contact placeholder(s) 163 by the substrative removal technique, the faux S/D region 166 there above (as depicted) is at least partially exposed.

FIG. 15 depicts cross-sectional views of semiconductor IC device 100 shown after exemplary fabrication operation(s), in accordance with one or more embodiments. In the depicted fabrication stage, backside contact(s) 223 are formed within the active regions and backside contact(s) 225 are formed within the ESD region, and backside contact 206 may be formed within the DDB region(s) 182. The backside contact(s) 223 may be formed in contact with or melded against the exposed respective portion of the S/D region 164 there above (as depicted). Similarly, the backside contact(s) 225 may be formed in contact with or melded against the exposed respective portion of the faux S/D region 166 there above (as depicted).

The backside contacts 223, 225 may be formed by depositing conductive material, such as metal into the respective backside contact openings. In an example, the backside contacts 223, 225 may be formed by depositing a silicide liner, such as Ni, NiPt or Ti, etc. into the backside contact openings, depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective bottom surfaces (as depicted) of backside contacts 223, 225 and ILD 220 may be coplanar.

Figure 16:
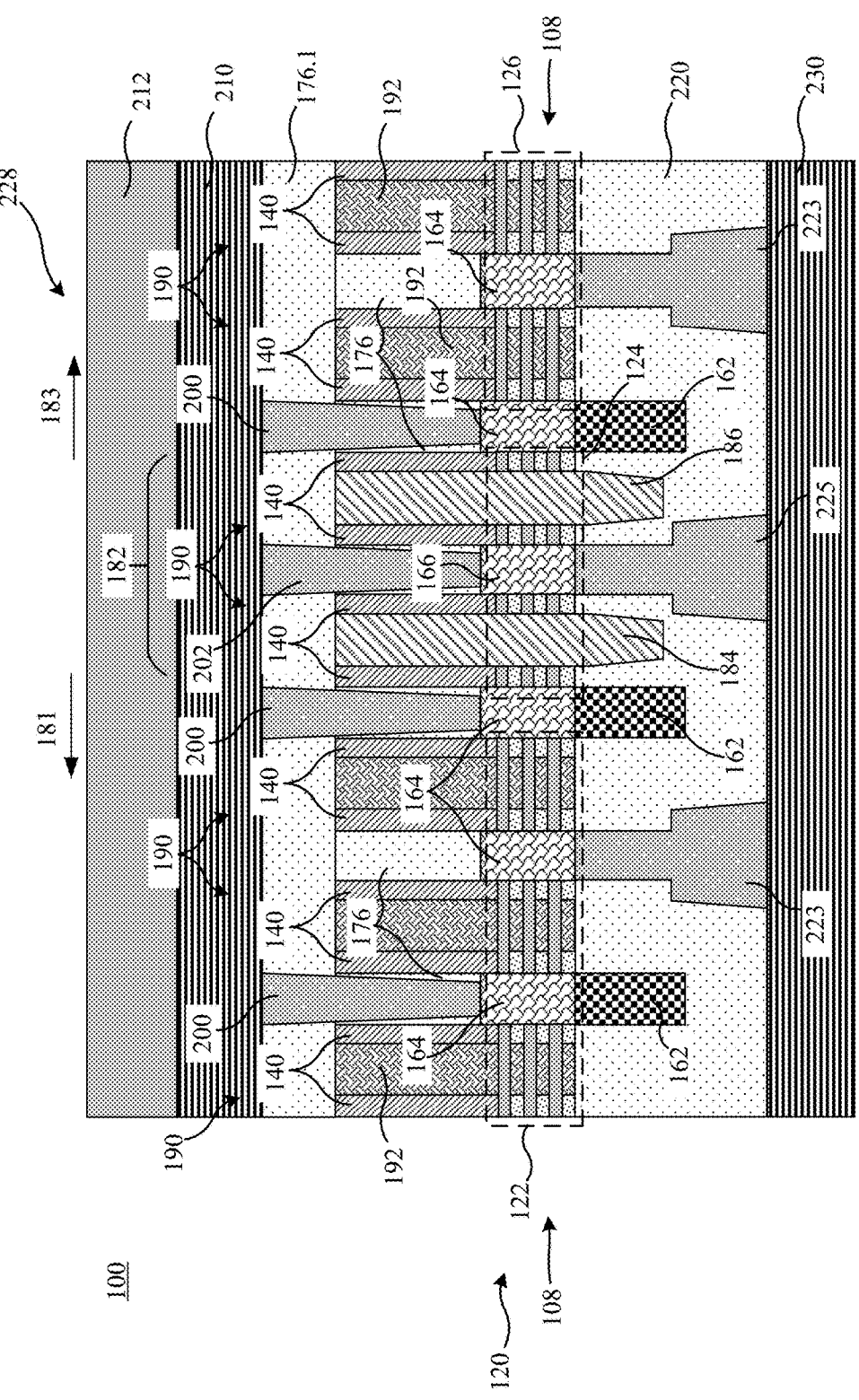

FIG. 16 depicts cross-sectional views of semiconductor IC device 100 shown after exemplary fabrication operation(s), in accordance with one or more embodiments. In the depicted fabrication stage, BSPDN 230 is formed upon the backside contacts 223, 225 and upon the ILD 220.

BSPDN 230 includes conductive power rails within different metallization levels, associated metallization dielectric or passivation layers, vertical vias that connect predetermined power rails within the metallization levels with an above device or structure, or the like. In some examples, there may be five metal levels M0-M4 within BSPDN 230. In some examples, there may be more than ten metal levels within BSPDN 230. In some examples, backside contact 223 may contact and connect the respective S/D region 164 there above to a power rail via, a power rail, or the like, located within the lowest BSPDN metal level M0. Likewise, backside contact 225 may contact and connect the respective faux S/D region 166 there above to a power rail via, a power rail, or the like, located within the lowest BSPDN metal level M0.

Generally, the BSPDN 230 is located on the backside of the semiconductor IC device 100. In other words, BSPDN 230 is located on the oppose facing side of the semiconductor IC device 100 relative to frontside BEOL network 210.

For clarity, semiconductor IC device 100 includes one or more conductive through device connection(s) 228 within one or more respective DDB region(s) 182 that separates active region 181 from an active region 183. The conductive through device connection 228 connects to and/or accesses the frontside of the semiconductor IC device 100 and connects to and/or accesses the backside of the semiconductor IC device 100. In an example, the conductive through device connection 228 includes the frontside contact 202, the backside contact 225, and the faux S/D region 166 between the frontside contact 202 and the backside contact 225. The frontside contact 202, the backside contact 225, and the faux S/D region 166 may be vertically aligned (i.e., they share the same vertical bisector), as depicted. The vertical alignment of the conductive through device connection 228 may reduce the resistance through the semiconductor IC device 100.

The DDB region 182 may include and at least be partially defined by the diffusion break isolation rail 184 and a diffusion break isolation rail 186. The conductive through device connection 228 may be located between diffusion break isolation rail 184 and diffusion break isolation rail 186. Diffusion break isolation rail 184 and diffusion break isolation rail 186 may be connected to respective faux channels (i.e., portions of active nanolayers 108 under spacer(s) 140). Similarly, faux S/D region 166 may also be connected to one or more of the respective faux channels.

The diffusion break isolation rails 184, 186 may serve to define the lateral boundary of DDB region 182. For example, a right sidewall of diffusion break isolation rail 186 may serve as a right-side boundary to DDB region 182 and a left sidewall of diffusion break isolation rail 184 may serve as a left side boundary to DDB region 182.

In an example, diffusion break isolation rails 184, 186 may also serve as a gate cut isolation region that separate inline replacement gate structure(s) 190 that exist further into and out of the page between the spacers 140 associated or shared with the respective diffusion break isolation rails 184, 186. In other words, the diffusion break isolation rails 184, 186 may have a dimension into and/or out of the page sufficient to separate replacement gate structure(s) 190 that exist further into and out of the page that are inline therewith and share the same spacer(s) 140.

The conductive through device connection 228 within the DDB region 182 takes advantage of the plot space associated with the DDB region 182 and may resultantly increase packing densities of the semiconductor IC device 100. Further, the conductive through device connection 228 within the DDB region 182 may reduce routing complexities through the semiconductor IC device 100 and may further reduce parasitic capacitance therewithin relative to other through device connection structures.

The conductive through device connection 228 within the DDB region 182 may be connected to the front side BEOL network 210 that is located on the frontside of the semiconductor IC device 100 and may be connected to a BSPDN 230 that is located on the backside of the semiconductor IC device 100.

In utilizing the BSPDN 230, the conductive through device connection 228 may provide a reduced resistance through the semiconductor IC device 100, relative to other through device connection structures, which may improve semiconductor IC device 100 performance. Further, the conductive through device connection 228 within the DDB region 182 may utilize mirrored or similar structure instances (e.g., frontside contact 202, backside contact 225, faux S/D region 24, or the like) as that are used by microdevices (e.g., transistors, or the like) within the active regions 181, 183 of the semiconductor IC device 100, which may decrease semiconductor IC device 100 fabrication complexities.

In a particular example, the frontside contact 202 of the conductive through device connection 228 may be connected to an I/O pad within the frontside BEOL network 210. The I/O pad may be connected to a higher-level subsystem such as a carrier, motherboard, or the like, that which may provide power potential (e.g., VDD potential, VSS potential, etc.) to the conductive through device connection 228. In turn, the conductive through device connection 228 may provide this power potential to one or more predetermined power rails within the BSPDN 230. For example, a first conductive through device connection 228 within a first DDB region 182 may provide VDD potential to one or more predetermined VDD power rails within the BSPDN 230, a second conductive through device connection 228 within a second DDB region 182 may provide VSS potential to one or more predetermined VSS power rails within the BSPDN 230.

Semiconductor IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

FIG. 17 depicts a flow diagram illustrating method 300 to fabricate semiconductor IC device 100 that includes a conductive through device connection within a DDB region, according to one or more embodiments of the present disclosure. The depicted fabrication operations of method 300 are illustrated and described above with reference to one or more of FIG. 3 through FIG. 16 of the drawings. The method 300 depicted herein is exemplary. There can be many variations to the diagram or operations described therein without departing from the spirit of the embodiments. For instance, the operations can be performed in a differing order, or operations can be added, deleted, or modified.

At block 302, method 300 may begin with forming nanolayers upon a substrate and patterning the nanolayers into one or more nanolayer stacks. For example, method 300 may include initially fabricating an alternating series of sacrificial nanolayers 106 and active nanolayers 108 upon upper substrate 102. Further, method 300 may include patterning the nanolayers to form one or more nanolayer stack(s) 120.

At block 304, method 300 may further continue with forming one or more sacrificial gate structure(s) and with forming one or more gate spacers upon the one or more sacrificial gate structure(s). For example, method 300 may include forming one or more sacrificial gate structures 134 upon the upper substrate 112 and upon and around the nanolayer stack(s) 120. Further, method 300 may include forming one or more spacer(s) 140 upon the upper substrate 102 and upon the sidewall(s) of the sacrificial gate structures 134. The spacer(s) 140 may be respectively formed upon upper substrate 102, may be formed upon and around nanolayer stack(s) 120, and may be formed upon and around the one or more sacrificial gate structure(s) 134, respectively.

At block 306, method 300 may further continue with recessing the nanolayer stacks, with r indenting the sacrificial nanolayers within the nanolayer stacks, and with forming a respective inner spacer within the recesses or indent. For example, method 300 may include forming S/D recesses 150 within the nanolayer stack(s) 120 between spacers 140 associated with neighboring sacrificial gate structures 134. Further, method 300 may include indenting the sacrificial nanolayers 106 within nanolayer stack(s) 120, thereby forming an indent void. Method 300 may further include forming an inner spacer 144 within a respective indent void.

At block 308, method 300 may further continue with forming one or more backside contact placeholder openings, with forming a backside contact placeholder within a respective backside contact placeholder opening, with forming one or more S/D structures, and with forming an ILD. For example, method 300 may include forming or more backside contact placeholder(s) 162 within upper substrate 102. Further, method 300 may include forming one S/D region 164 upon a respective backside contact placeholder 162. Still further, method 300 may include forming ILD 176 upon S/D region(s) 164 and upon upper substrate 102.

At block 310, method 300 may further continue with forming one or more diffusion break trench(es) and with forming a diffusion break isolation rail within a respective diffusion break trench. For example, method 300 may include forming and patterning mask 180 to at least partially define DDB region(s) 182. Further, method 300 may include forming one or more DDB trench(es) 135 by removing the sacrificial gate structures 134, by removing the active nanolayers 108, by removing the sacrificial nanolayers 106 between spacer(s) 140 that are associated with the same sacrificial gate structure 134, and/or removing a portion of the upper substrate 102 within DDB region(s) 182. Further, method 300 may include forming a diffusion break isolation rail 184 and/or a diffusion break isolation rail 186 within a respective one of the DDB trench(es) 135. Further, the removal of the sacrificial gate structures 134, the removal of active nanolayers 108, the removal of sacrificial nanolayers 106, and/or the removal of associated trench portion(s) of the upper substrate 102 effectively changes or otherwise transforms S/D region 164 within the DDB region(s) 182 into faux S/D region 166.

At block 312, method 300 may continue with removing the one or more sacrificial gate structure(s), with removing the sacrificial nanolayers, and with forming a replacement gate structure within the void or recess formed by the absence of a respective sacrificial gate structure. For example, method 300 may include removing the sacrificial gate structure(s) 134 and with removing the sacrificial nanolayers 106 and forming a respective replacement gate structure(s) 190 in place of a respective sacrificial gate structure 134 within the active region(s) adjacent to the DDB region(s) 182.

At block 314, method 300 may continue with MOL contact formation, with frontside BEOL network formation, and with bonding a carrier wafer thereto. For example, method 300 may include forming ILD 176.1 upon the replacement gate structure(s) 190 and upon the ILD 170, with forming a respective frontside contact 200 upon one or more S/D regions 164, and with forming a respective frontside contact 202 upon faux S/D region 166. Further, method 300 may include forming frontside BEOL network 210 upon the ILD 176.1 and upon the frontside contacts 200, 202. Still further, method 300 may include bonding carrier wafer 212 to the frontside BEOL network 210.

At block 316, method 300 may continue with flipping the wafer assembly, with removing the substrate from the backside to expose the appropriate backside contact placeholder(s) 162, 163. For example, method 300 may include flipping semiconductor IC device 100 using the carrier wafer 212 and removing lower substrate 101. Further, method 300 may include removing etch stop layer 103 and the upper substrate 102 to expose the replacement gate structure(s) 190, to expose the backside placeholder(s) 162, to expose the backside placeholder(s) 163, to expose the diffusion break isolation rail 184, and/or to expose the diffusion break isolation rail 186.

At block 318, method 300 may continue with forming a backside ILD, with patterning the backside ILD to form one or more backside contact trenches, with removing one or more of the backside contact placeholder structures, with forming a backside contact within the one or more backside contact trenches, and with forming the BSPDN. For example, method 300 may include forming ILD 220 upon the exposed replacement gate structure(s) 190, the exposed backside placeholder(s) 162, the exposed backside placeholder(s) 163, the exposed diffusion break isolation rail 184, and/or the exposed diffusion break isolation rail 186.

Still further, method 300 may include forming backside contact opening 222 within the active regions and with forming backside contact opening 224 within the DDB region(s) 182. The formation of backside contact opening 222 may expose a respective backside contact placeholder(s) 162 which may be subsequently removed by a substrative removal technique, such as an etch. Upon removal of the backside contact placeholder(s) 162, the S/D region 164 associated therewith is at least partially exposed. The formation of backside contact opening 224 may expose a respective backside contact placeholder(s) 163 which may be subsequently removed by a substrative removal technique, such as an etch. Upon removal of the backside contact placeholder(s) 163, the faux S/D region 166 associated therewith is at least partially exposed.

Still further, method 300 may include forming backside contact 223 within backside contact opening 222 in the active regions and may include forming backside contact 225 within backside contact opening 224 in the DDB region(s) 182. The backside contact 223 may be formed in contact with or melded against the exposed portion of the S/D region 164 associated therewith. The backside contact 225 may be formed in in contact with or melded against the exposed portion of the faux S/D region 166 associated therewith.

Still further, method 300 may include forming BSPDN 230 upon the ILD 220 and upon the backside contacts 223, 225. Method 300 may further include removing the carrier wafer 212 and other subsequent fabrication stages to, for example, fabricate a IC chip, an end product, or the like.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor integrated circuit (IC) device comprising:
   a dual diffusion break (DDB) region between respective active regions; and
   a conductive through device connection within the DDB region, the conductive through device connection comprising a faux source/drain (S/D) region.

2. The semiconductor IC device of claim 1, wherein the DDB region comprises:

a first diffusion break isolation rail; and a second diffusion break isolation rail.

3. The semiconductor IC device of claim 2, wherein the conductive through device connection is between the first diffusion break isolation rail and the second diffusion break isolation rail.

4. The semiconductor IC device of claim 3, wherein the conductive through device connection further comprises a frontside contact and a backside contact, and wherein the faux S/D region is between the frontside contact and the backside contact.

5. The semiconductor IC device of claim 4, further comprising:

a first one or more faux channels that connect the faux S/D region and the first diffusion break isolation rail; and a second one or more faux channels that connect the faux S/D region and the second diffusion break isolation rail.

6. The semiconductor IC device of claim 4, further comprising:

a front side back end of line (BEOL) network connected to the frontside contact; and a back side power distribution network (BSPDN) connected to the backside contact.

7. The semiconductor IC device of claim 4, wherein the frontside contact, the backside contact, and the faux S/D region are vertically aligned.

8. The semiconductor IC device of claim 3, wherein a bottom surface of the faux S/D region is above respective bottom surfaces of the first diffusion break isolation rail and the second diffusion break isolation rail.

9. The semiconductor IC device of claim 2, further comprising:

a first spacer, wherein the first diffusion break isolation rail is between the first spacer; and a first conductive gate between the first spacer and in line with the first diffusion break isolation rail.

10. The semiconductor IC device of claim 1, wherein an active region of the respective active regions comprises:

a transistor comprising a S/D region.

11. The semiconductor IC device of claim 10, wherein the faux S/D region structurally and materially mirrors the S/D region.

12. The semiconductor IC device of claim 11, wherein the active region of the respective active regions comprises:

a backside contact placeholder below and connected to the S/D region.

13. A semiconductor IC device comprising:

a first diffusion break isolation rail;

a second diffusion break isolation rail; and a conductive through device connection between the first diffusion break isolation rail and the second diffusion break isolation rail, wherein the conductive through device connection comprises a faux source/drain (S/D) region.

14. The semiconductor IC device of claim 13, wherein the conductive through device connection further comprises a frontside contact and a backside contact, and wherein the faux S/D region is between the frontside contact and the backside contact.

15. The semiconductor IC device of claim 14, further comprising:

a front side back end of line (BEOL) network connected to the frontside contact; and a back side power distribution network (BSPDN) connected to the backside contact.

16. The semiconductor IC device of claim 14, wherein the frontside contact, the backside contact, and the faux S/D region are vertically aligned.

17. The semiconductor IC device of claim 13, further comprising:

a first one or more faux channels that connect the faux S/D region and the first diffusion break isolation rail; and a second one or more faux channels that connect the faux S/D region and the second diffusion break isolation rail.

18. The semiconductor IC device of claim 13, further comprising:

a transistor comprising a S/D region, and wherein a third one or more faux channels connect the first diffusion break isolation rail and the S/D region.

19. The semiconductor IC device of claim 18, wherein the faux S/D region structurally and materially mirrors the S/D region.

* * * * *